(12) United States Patent
Furubayashi et al.

(10) Patent No.: US 12,362,289 B2
(45) Date of Patent: Jul. 15, 2025

(54) SEMICONDUCTOR STORAGE DEVICE

(71) Applicant: KIOXIA CORPORATION, Tokyo (JP)

(72) Inventors: Ken Furubayashi, Yokohama Kanagawa (JP); Sachiyo Ito, Kawasaki Kanagawa (JP); Takuya Konno, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 504 days.

(21) Appl. No.: 17/680,126

(22) Filed: Feb. 24, 2022

(65) Prior Publication Data
US 2022/0384363 A1 Dec. 1, 2022

(30) Foreign Application Priority Data

Jun. 1, 2021 (JP) ................................. 2021-092365

(51) Int. Cl.
*H01L 23/00* (2006.01)
*H10B 43/27* (2023.01)
*H10B 43/40* (2023.01)

(52) U.S. Cl.
CPC ........... *H01L 23/562* (2013.01); *H10B 43/27* (2023.02); *H10B 43/40* (2023.02)

(58) Field of Classification Search
CPC ....... H01L 23/562; H10B 43/27; H10B 43/40; H10B 41/27; H10B 41/40
See application file for complete search history.

(56) References Cited

U.S. PATENT DOCUMENTS

| | | | |
|---|---|---|---|
| 9,401,371 B1 | 7/2016 | Lee et al. | |
| 2011/0019480 A1 | 1/2011 | Kito et al. | |
| 2012/0193705 A1* | 8/2012 | Lim | G11C 5/025 |
| | | | 257/330 |
| 2013/0113032 A1 | 5/2013 | Matsuda et al. | |
| 2014/0175534 A1 | 6/2014 | Kofuji et al. | |
| 2015/0214242 A1* | 7/2015 | Lee | H10B 43/35 |
| | | | 257/329 |
| 2015/0333221 A1 | 11/2015 | Bibl et al. | |
| 2017/0263613 A1* | 9/2017 | Murakoshi | H10B 43/20 |

(Continued)

FOREIGN PATENT DOCUMENTS

| | | |
|---|---|---|
| JP | 2013-098470 A | 5/2013 |
| JP | 2014-127475 A | 7/2014 |

(Continued)

*Primary Examiner* — Joseph C. Nicely
*Assistant Examiner* — Alvin L Lee
(74) *Attorney, Agent, or Firm* — Kim & Stewart LLP

(57) ABSTRACT

A semiconductor storage device includes a stacked body in which a plurality of conductive layers and a plurality of insulating layers are alternately stacked along a stacking direction, and a plurality of first pillars extending in the stacked body along the stacking direction to form memory cells at intersections with at least some of the plurality of conductive layers. The stacked body includes a stair portion in which the plurality of conductive layers are stacked in a stepped manner at a position separated from the plurality of first pillars in a first direction intersecting the stacking direction. At least a lowermost insulating layer of the plurality of insulating layers has at least one bending portion bent in the stacking direction at an end of the plurality of conductive layers in the stair portion along the first direction.

19 Claims, 15 Drawing Sheets

(56) References Cited

U.S. PATENT DOCUMENTS

| | | |
|---|---|---|
| 2017/0263618 A1 | 9/2017 | Shimojo |
| 2018/0076085 A1 | 3/2018 | Hazue |
| 2018/0247940 A1 | 8/2018 | Kim et al. |
| 2018/0269221 A1 | 9/2018 | Oda et al. |
| 2019/0148286 A1 | 5/2019 | Or-Bach et al. |
| 2020/0251484 A1 | 8/2020 | Ito et al. |
| 2020/0273873 A1 | 8/2020 | Hua et al. |
| 2021/0126009 A1 | 4/2021 | Luo et al. |

FOREIGN PATENT DOCUMENTS

| | | |
|---|---|---|
| JP | 2018-157096 A | 10/2018 |
| TW | 201114021 A | 4/2011 |
| TW | 201547015 A | 12/2015 |
| TW | 201712912 A | 4/2017 |
| TW | 201803092 A | 1/2018 |
| TW | 201824521 A | 7/2018 |
| TW | 202036863 A | 10/2020 |

* cited by examiner

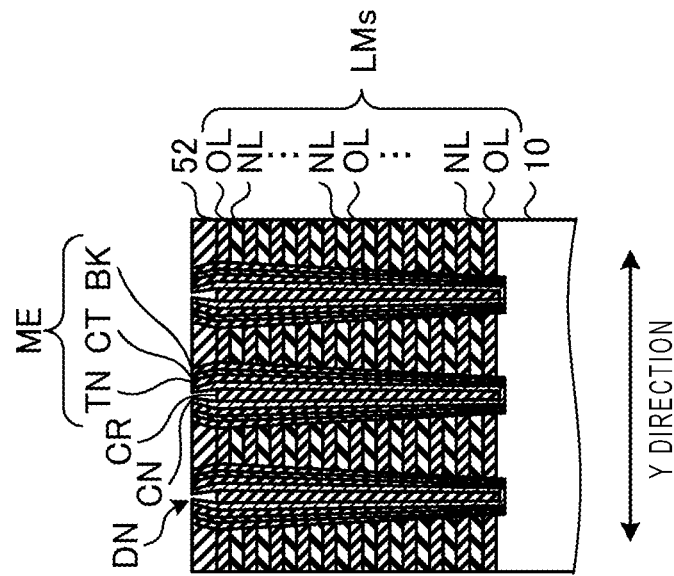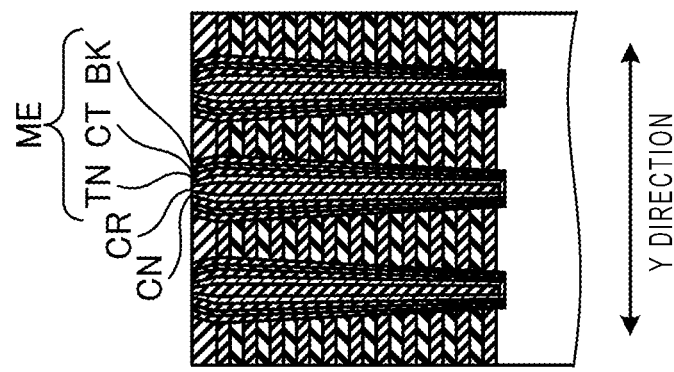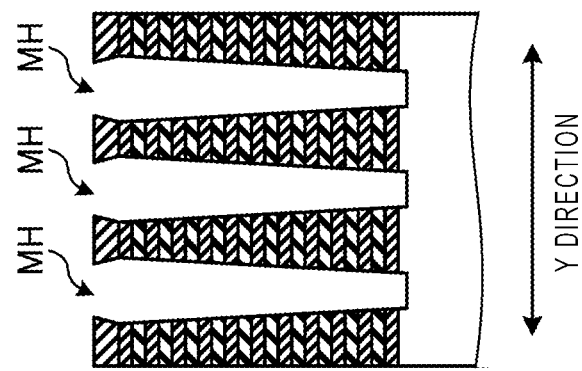

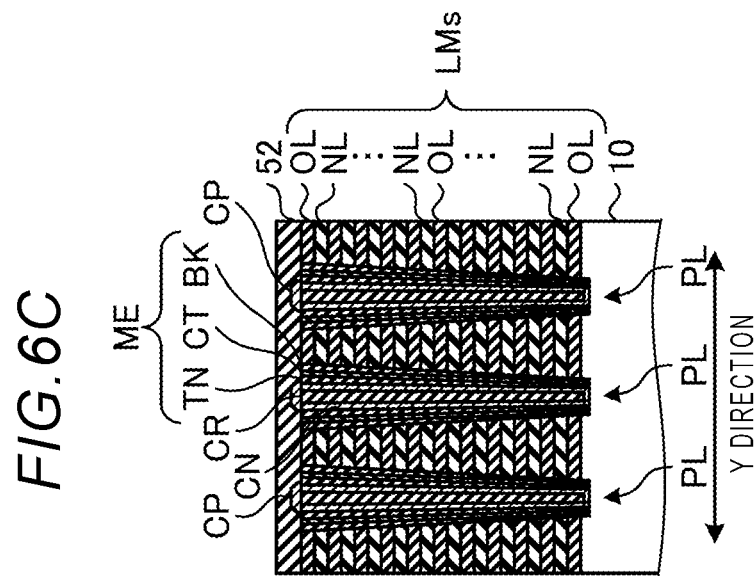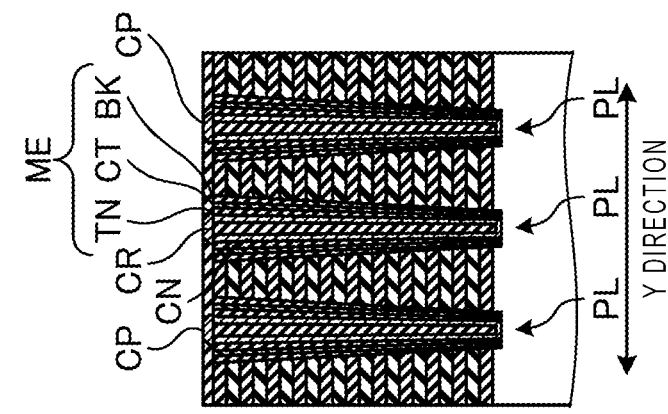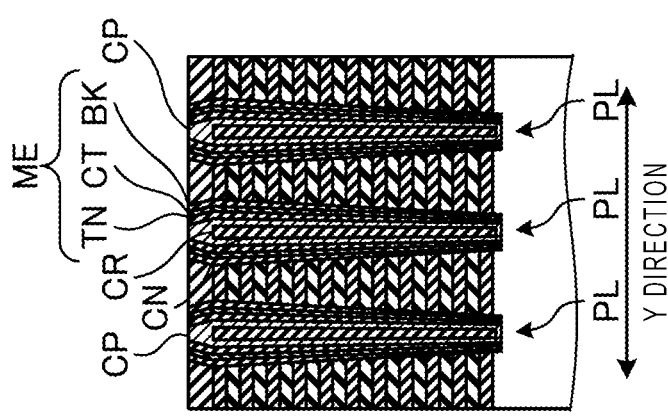

SEMICONDUCTOR STORAGE DEVICE

CROSS-REFERENCE TO RELATED APPLICATION(S)

This application is based upon and claims the benefit of priority from Japanese Patent Application No. 2021-092365, filed Jun. 1, 2021, the entire contents of which are incorporated herein by reference.

FIELD

Embodiments described herein relate generally to a semiconductor storage device.

BACKGROUND

In the manufacturing process of a semiconductor storage device such as a three-dimensional nonvolatile memory, for example, a plurality of insulating layers are formed, and then replaced with conductive layers to form a stacked body of the conductive layers. At the time of replacement with the conductive layers, the stacked body becomes fragile due to removal of the plurality of insulating layers.

BRIEF DESCRIPTION OF THE DRAWINGS

FIG. 5A through FIG. 5C depict a method of manufacturing a semiconductor storage device according to an embodiment.

FIG. 6A through FIG. 6C depict a method of manufacturing a semiconductor storage device according to an embodiment.

DETAILED DESCRIPTION

Embodiments provide a semiconductor storage device capable of increasing the strength of a stacked body.

In general, according to one embodiment, a semiconductor storage device includes a stacked body in which a plurality of conductive layers and a plurality of insulating layers are alternately stacked along a stacking direction, and a plurality of first pillars extending in the stacked body along the stacking direction to form memory cells at intersections with at least some of the plurality of conductive layers. The stacked body includes a stair portion in which the plurality of conductive layers are stacked in a stepped manner at a position separated from the plurality of first pillars in a first direction intersecting the stacking direction. At least a lowermost insulating layer of the plurality of insulating layers has at least one bending portion bent in the stacking direction at an end of the plurality of conductive layers in the stair portion along the first direction.

Hereinafter, certain example embodiments of the present disclosure will be described with reference to the drawings. The present disclosure is not limited to these example embodiments. In addition, obvious variations, modifications, and adaptions of the elements in the example embodiments apparent to those skilled in the art or those that have substantially the same functions or characteristics are included.

(Configuration Example of Semiconductor Storage Device)

Figure 1A:
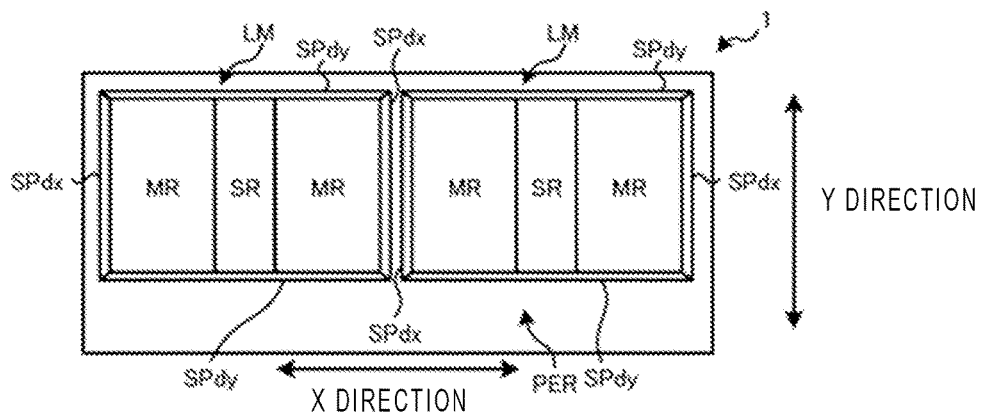
FIG. 1A through FIG. 1E are views illustrating a structure of a semiconductor storage device according to an embodiment.
Figure 1B:
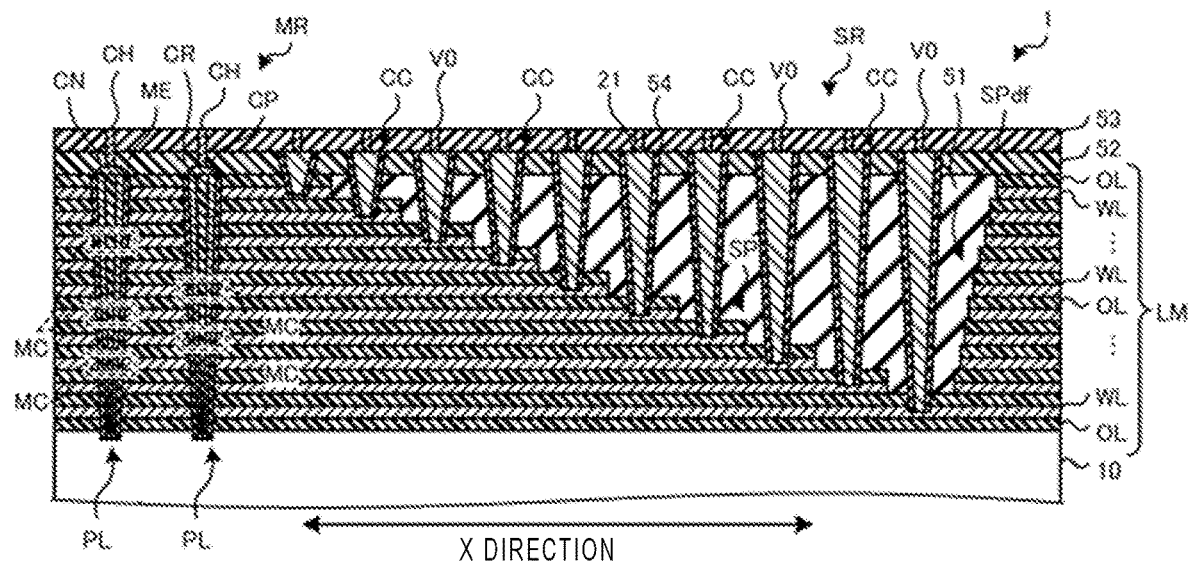
Figure 1C:
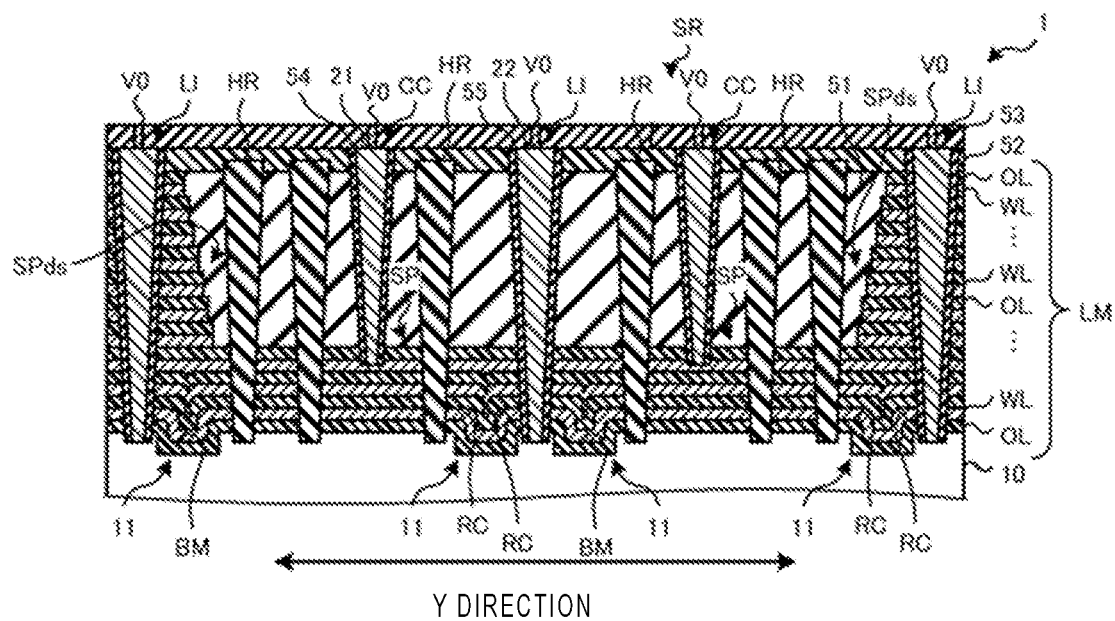
Figure 1D:
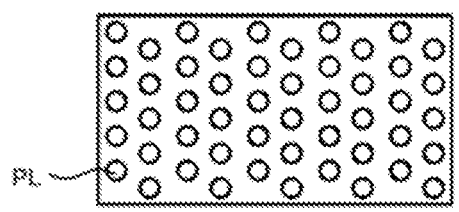
Figure 1E:
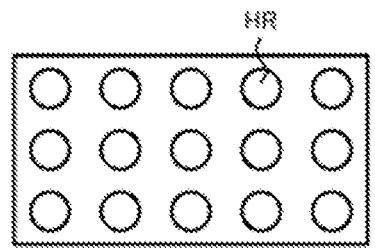

FIGS. 1A to 1E are views illustrating a structure of a semiconductor storage device 1 according to an embodiment. FIG. 1A is a schematic plane view illustrating the semiconductor storage device 1. FIG. 1B is a cross-sectional view of a stacked body LM of the semiconductor storage device 1 taken along an X direction. FIG. 1C is a cross-sectional view of the stacked body of the semiconductor storage device 1 taken along a Y direction. FIG. 1D is a schematic view illustrating an arrangement pattern of pillars PL when viewed from a stacking direction (e.g., a Z direction intersecting the X and Y directions) of the stacked body LM. FIG. 1E is a schematic view illustrating an arrangement pattern of columnar portions HR when viewed from the stacking direction of the stacked body LM. In FIGS. 1B and 1C, some elements such as upper layer wiring are not shown.

In the present specification, both the X direction and the Y direction are parallel to the upper surface of a base layer 10, and the X direction and the Y direction are orthogonal to each other. Furthermore, in the present specification, the upper side of the semiconductor storage device 1 corresponds to the side facing the terrace surface of a stair portion SP to be described later.

As illustrated in FIGS. 1A to 1C, the semiconductor storage device 1 includes the stacked body LM disposed on the base layer 10, and a peripheral region PER disposed around the stacked body LM. In the example of FIG. 1A, the semiconductor storage device 1 includes, for example, two stacked bodies LM arranged in the X direction. However, the number of stacked bodies LM provided in the semiconductor storage device 1 may be one, or three or more.

As illustrated in FIG. 1A, the stacked body LM is formed in substantially a rectangular shape when viewed from above, and has a longitudinal direction along the X direction and a lateral direction along the Y direction. The stacked body LM includes memory regions MR, a stair region SR, and dummy stair portions SPdx and SPdy. For example, the stair region SR is disposed at or near the center of the stacked body LM in the longitudinal direction, and the memory regions MR are disposed on both sides of the stair region SR in the longitudinal direction. The dummy stair portions SPdx are disposed at both ends of the stacked body LM in the longitudinal direction, and the dummy stair portions SPdy are disposed at both ends of the stacked body LM in the lateral direction.

For example, an insulating layer that reaches at least the height of the upper surface of the stacked body LM is disposed in the peripheral region PER.

As illustrated in FIGS. 1B and 1C, the base layer 10 is a layer which is composed of, for example, a semiconductor or a conductor and supports the stacked body LM. A plurality of recesses 11 are disposed on the upper surface of the base layer 10 below the stair region SR, apart from each other in the lateral direction (the Y direction) of the stacked body LM. Each recess 11 has a shape dented from the upper surface of the base layer 10 and extends along the longitudinal direction of the stacked body LM.

In the stacked body LM, a plurality of word lines WL as conductive layers and a plurality of insulating layers OL are disposed on the upper surface of the base layer 10 and alternately stacked one by one. The word line WL is, for example, a tungsten layer or a molybdenum layer. The insulating layer OL is, for example, a silicon oxide layer or the like.

Some of the insulating layers OL including the lowermost insulating layer OL and some of the word lines WL on the lower layer side of the stacked body LM are bent in the layer thickness direction along the recess 11 of the base layer 10.

That is, in the stair region SR, at least the lowermost insulating layer OL has a pair of bending portions RC covering the corners formed by the side walls of the recesses 11 facing each other in the lateral direction of the stacked body LM and the upper surface of the base layer 10. Each bending portion RC may have an angular shape along the corner of the recess 11. Alternatively, the bending portion RC may have a curved shape so as to cover the corner of the recess 11 with a curved surface.

Further, at least the lowermost insulating layer OL has a flat portion BM that is sandwiched between the pair of bending portions RC and covers the bottom surface of the recess 11. The flat portion BM is located below the other portion of the insulating layer OL in the stacking direction of the stacked body LM. A distance from the upper surface of the flat portion BM to the upper surface of the other portion of the insulating layer OL is preferably 20% or more of the thickness of the insulating layer OL. Such a degree of bending may be adjusted according to, for example, the depth of the recess 11 of the base layer 10.

Here, when the bending portion RC has an angular shape, the insulating layer OL above the recess 11 has a crank-like shape that includes the pair of bending portions RC and the flat portion BM between them and is bent multiple times along the lateral direction of the stacked body LM. When the bending portion RC has a curved shape, the insulating layer OL above the recess 11 has a fold-like shape that includes the pair of bending portions RC and the flat portion BM between them and is curved multiple times along the lateral direction of the stacked body LM.

The degree of bending of the insulating layer OL and the word line WL becomes weaker on the upper layer side of the stacked body LM, and each layer becomes substantially flat on the upper layer side of the stacked body LM.

In the example of FIGS. 1B and 1C, the stacked body LM has 10 layers of word lines WL, but any number of layers of word lines WL may be stacked. Further, the stacked body LM may have one or more select gate lines below the lowermost word line WL. Further, the stacked body LM may have one or more select gate lines above the uppermost word line WL.

The stacked body LM is divided in the lateral direction (the Y direction) by a plurality of contacts LI as plate-like portions that penetrate the stacked body LM along the stacking direction of the stacked body LM and extend along the longitudinal direction of the stacked body LM. The plurality of contacts LI are disposed apart from each other in the lateral direction of the stacked body LM, and reach the base layer 10 from the upper surface of an insulating layer 52, which will be described later.

Further, as described above, the recess 11 is disposed in the stair region SR in the vicinity of the base of each contact LI that reaches the base layer 10. That is, one recess 11 extends in the longitudinal direction of the stacked body LM along the contact LI at the ends of the stacked body LM divided by the contact LI in the stair region SR.

Similarly, a pair of bending portions RC on one recess 11 extends in the longitudinal direction of the stacked body LM along the contact LI at the ends of the one-sided stacked body LM divided by the contact LI in the stair region SR. In other words, at least the lowermost insulating layer OL has a crank shape or a fold shape, including the pair of bending portions RC, at the ends of each stacked body LM divided by the contact LI in the stair region SR.

Each contact LI includes an insulating layer 55 such as a silicon oxide layer disposed on the side wall of the stacked body LM in the lateral direction, and a conductive layer 22 such as a tungsten layer filled in the insulating layer 55. The upper portion of the conductive layer 22 is connected to an upper layer wiring or the like by a plug V0 penetrating an insulating layer 53, and the bottom portion of the conductive layer 22 is connected to the base layer 10. Thereby, the contact LI functions as, for example, a source line contact.

However, an insulating layer or the like may be filled instead of the conductive layer 22 to form a plate-like portion that does not have a function as a source line contact.

In the memory region MR, a plurality of pillars PL extending in the stacked body LM along the stacking direction of the stacked body LM and reaching the base layer 10 are disposed in a disperse manner, and as illustrated in FIG. 1D, are arranged in a staggered pattern, for example, when viewed from the stacking direction of the stacked body LM.

Each pillar PL has a shape such as a circular shape, an elliptical shape, or an oval shape, as a sectional shape in a direction along each layer of the stacked body LM. The pillar PL has a memory layer ME and a channel layer CN in this order from the outer peripheral side, and further has a core layer CR filled in the channel layer CN. As will be described later, the memory layer ME has a stacked structure in which a block insulating layer, a charge storage layer, and a tunnel insulating layer are stacked in this order from the outer peripheral side of the pillar PL. The channel layer CN is also disposed at the bottom of the pillar PL and is connected to the base layer 10.

Further, the pillar PL has a cap layer CP that is connected to the channel layer CN at the upper part thereof and at least covers the upper surfaces of the channel layer CN and the core layer CR. The upper surface of the cap layer CP is connected to an upper layer wiring such as a bit line by a plug CH penetrating the insulating layers 53 and 52.

The block insulating layer and tunnel insulating layer of the memory layer ME, and the core layer CR are, for example, a silicon oxide layer and the like. The charge storage layer of the memory layer ME is, for example, a silicon nitride layer or the like. The channel layer CN and the cap layer CP are, for example, a polysilicon layer, an amorphous silicon layer, or the like.

A memory cell MC is formed at a portion where the pillar PL configured in this way and a word line WL of each layer face each other. That is, a plurality of memory cells MC are arranged side by side in the height direction of the individual pillars PL arranged in the form of a matrix, for example. As a result, the semiconductor storage device 1 is configured as, for example, a three-dimensional nonvolatile memory in which the memory cells MC are arranged three-dimensionally.

When the stacked body LM has a select gate line above or below the upper layer or the lower layer of the word lines WL, a select gate is formed at a portion where the pillar PL and the select gate line face each other.

The stair portion SP is disposed in the stair region SR. The stair portion SP has a shape in which a plurality of word lines WL are stepped down in the longitudinal direction of the stacked body LM. As a result, the terrace surface of each step of the stair portion SP is formed by the individual insulating layer OL, and the word line WL is drawn out to the lower layer of the terrace surface.

A contact CC that penetrates the insulating layers 52 and 51 and the insulating layer OL forming the terrace surface of each step and reaches the word line WL of the lower layer of the insulating layer OL is disposed in each step of the stair portion SP. Each contact CC includes an insulating layer 54 such as a silicon oxide layer disposed on the side wall of the contact CC, and a conductive layer 21 such as a copper layer filled in the insulating layer 54. The upper portion of the conductive layer 21 is connected to an upper layer wiring or the like by the plug V0 penetrating the insulating layer 53, and the bottom portion of the conductive layer 21 is connected to the corresponding word line WL.

As a result, a predetermined voltage is applied to a memory cell MC via a word line WL, and data may be written to and read from the memory cell MC. When the stacked body LM has a select gate line above or below the upper layer or the lower layer of the word lines WL, a select gate may be turned on or off by applying a predetermined voltage to the select gate via the select gate line, so that a memory cell MC formed in a pillar PL to which the select gate belongs can be in a selected state or a non-selected state.

A dummy stair portion SPdf is disposed in the stair region SR so as to face the stair portion SP in the longitudinal direction of the stacked body LM. The dummy stair portion SPdf has a shape in which a plurality of word lines WL are stepped down toward the stair portion SP. The terrace surface of each step of the dummy stair portion SPdf is narrower than the terrace surface of the stair portion SP. That is, the dummy stair portion SPdf has a steeper slope than the stair portion SP, and the stair length of the dummy stair portion SPdf, that is, a distance from the uppermost step to the lowest step, is shorter than the stair length of the stair portion SP.

A contact LI is disposed at each end in the lateral direction (the Y direction) of the stacked body LM in the stair region SR, and a dummy stair portion SPds is disposed adjacent to the contact LI. The dummy stair portion SPds has a shape in which a plurality of word lines WL are stepped down toward the contact LI disposed at the end of the stair portion SP. The terrace surface of each step of the dummy stair portion SPds is narrower than the terrace surface of the stair portion SP. That is, the dummy stair portion SPds has a steeper slope than the stair portion SP, and the stair length of the dummy stair portion SPds is shorter than the stair length of the stair portion SP.

In this way, the stair region SR includes a bowl-shaped region surrounded by the stair portion SP, the contact LI, and the dummy stair portions SPdf and SPds in a region which is near the center of the stacked body LM in the longitudinal direction and is between a pair of contacts LI adjacent to each other in the lateral direction of the stacked body LM. An insulating layer 51 that covers the stair portion SP and the dummy stair portions SPdf and SPds and reaches at least the height of the upper surface in the memory region MR of the stacked body LM is disposed in this bowl-shaped region of the stair region SR. The insulating layer 51 is, for example, a silicon oxide layer or the like.

Further, in the stair region SR, a plurality of columnar portions HR that penetrate the insulating layer 51 and the stacked body LM of each step of the stair portion SP or the dummy stair portions SPdf and SPds and reach the base layer 10 are disposed.

The columnar portions HR are disposed in a disperse manner in the stair region SR while avoiding interference with the contacts CC, and as illustrated in FIG. 1E, when viewed from the stacking direction of the stacked body LM, for example, they are arranged in the form of a grid. That is, the plurality of columnar portions HR are disposed at the intersections of orthogonal grids such as square grids or rectangular grids, which do not overlap with any contact CC when viewed from the stacking direction of the stacked body LM. The individual columnar portion HR has a shape such as a circular shape, an elliptical shape, or an oval shape, as a sectional shape in the direction along each layer of the stacked body LM.

Further, the individual columnar portion HR is composed of an insulator such as silicon oxide extending along the stacking direction of the stacked body LM, and does not contribute to the function of the semiconductor storage device 1. As will be described later, the columnar portion HR has a role of supporting the stacked body LM when the stacked body LM is formed from sacrificial layers and insulating layers that are stacked.

Further, as illustrated in FIGS. 1D and 1E, the pitch between the plurality of columnar portions HR is wider than, for example, the pitch between the plurality of pillars PL, and the arrangement density of the columnar portions HR per unit area of each layer of the stacked body LM is lower than the arrangement density of pillars PL per unit area of each layer of the stacked body LM. Further, the area of the section of the columnar portion HR along each layer of the stacked body LM is larger than, for example, the area of the section of the pillar PL along each layer of the stacked body LM.

In this way, for example, by making the sectional area of the pillar PL smaller and making the pitch of the pillar PL narrower than the columnar portion HR, it is possible to form a large number of memory cells MC at a high density in a stacked body LM of a predetermined size, which can increase the storage capacity of the semiconductor storage device 1. On the other hand, since the columnar portion HR is used exclusively for supporting the stacked body LM, a manufacturing load can be reduced because precise processing for a small sectional area and a narrow pitch like, for example, the pillar PL, is not necessary.

Here, FIG. 1C illustrates a section of the third step from the lowermost step of the stair portion SP. Stair portions SP are disposed on both sides in the lateral direction of the stacked body LM of the contact LI illustrated at the central portion of the paper surface of FIG. 1C. A dummy stair portion SPds is disposed on one side of each stair portion SP in the lateral direction.

Dummy stair portions SPdx at both ends in the longitudinal direction of the stacked body LM and dummy stair portions SPdy at both ends in the lateral direction of the stacked body LM are also configured in the same manner as the above-mentioned dummy stair portions SPdf and SPds.

That is, the dummy stair portion SPdx has a shape in which a plurality of word lines WL are stepped down toward the outside in the longitudinal direction of the stacked body LM. Further, the dummy stair portion SPdy has a shape in which a plurality of word lines WL are stepped down toward the outside in the lateral direction of the stacked body LM. Similar to the dummy stair portions SPdf and SPds, the stair lengths of these dummy stair portions SPdx and SPdy are shorter than the stair length of the stair portion SP.

An insulating layer that covers the dummy stair portions SPdx and SPdy and reaches at least the height of the upper surface in the memory region MR of the stacked body LM is disposed on each of the dummy stair portions SPdx and SPdy. In addition, columnar portions HR are also disposed in these dummy stair portions SPdx and SPdy. Further, the recess 11 may be disposed below the dummy stair portion SPdx that has different heights in the longitudinal direction of the stacked body LM, and the bending portion RC and the flat portion BM of the insulating layer OL may be disposed in the dummy stair portion SPdx.

The insulating layer 52 that covers the upper surface of the stacked body LM excluding the stair portion SP and the dummy stair portions SPdf, SPds, SPdx, and SPdy, and the insulating layer 51 disposed on the stair portion SP and the dummy stair portions SPdf and SPds is disposed on them. The insulating layer 53 is disposed on the insulating layer 52.

(Manufacturing Method of Semiconductor Storage Device)

Next, a method of manufacturing the semiconductor storage device 1 according to an embodiment will be described with reference to FIGS. 2 to 8B. FIGS. 2 to 8B are views illustrating an example of the manufacturing method of the semiconductor storage device 1.

Figure 2:
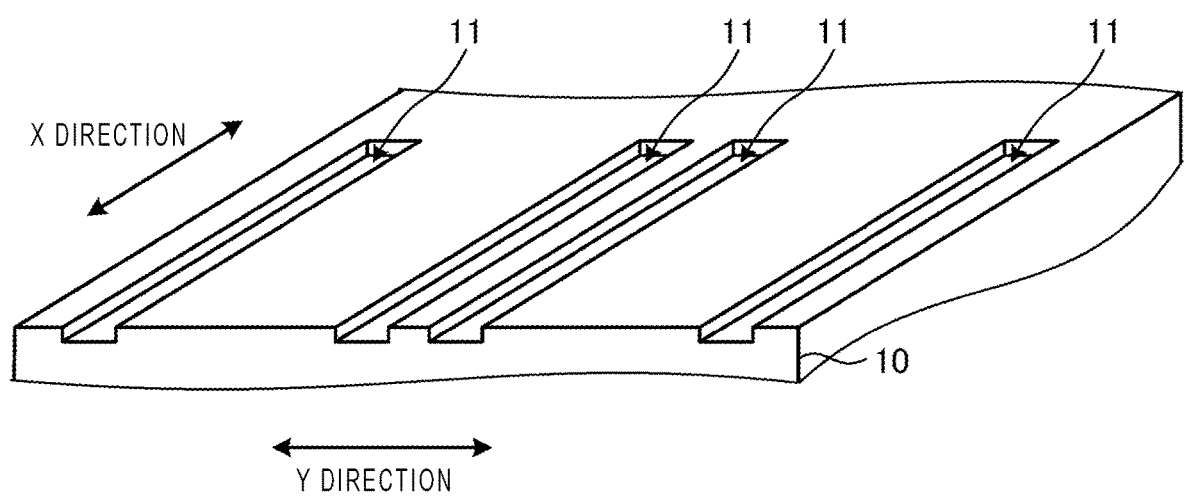
FIG. 2 depicts a method of manufacturing a semiconductor storage device according to an embodiment.

FIG. 2 illustrates a perspective view of the base layer 10 during the manufacturing process of the semiconductor storage device 1. As illustrated in FIG. 2, a plurality of recesses 11 are formed in the upper surface of the base layer 10. In the plurality of recesses 11, the stair region SR, the dummy stair portion SPdx, and the like are disposed later. The plurality of recesses 11 may be formed in the vicinity of a positions where the contacts LI are to be formed, by using, for example, a photolithography technique and an etching technique.

That is, a mask pattern such as a photoresist layer having an opening at a position where the recess 11 is to be formed is formed on the upper surface of the base layer 10. Then, the plurality of recesses 11 are formed by processing the base layer 10 by reactive ion etching (RIE) or the like.

Here, it is preferable that the depth of the recess 11 is adjusted such that a distance from the upper surface of the flat portion BM of the insulating layer OL to be formed later to the upper surface of the other portion of the insulating layer OL is 20% or more of the thickness of the insulating layer OL.

FIGS. 3A to 3D, FIGS. 4A to 4C, and FIGS. 7A to 7C illustrate cross-sections of a structure where the stair portion SP is to be formed along the Y direction. That is, FIGS. 3A to 3D, FIGS. 4A to 4C, and FIGS. 7A to 7C are cross-sectional views of the structure corresponding to FIG. 1C.

Figure 3A:
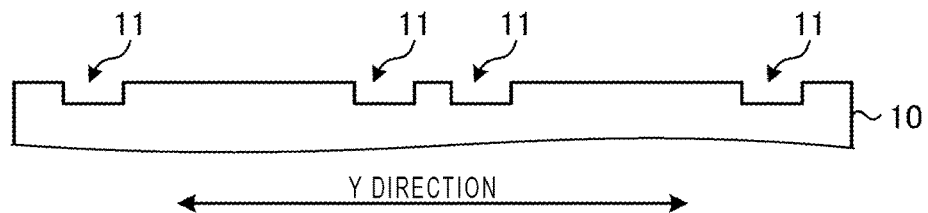
FIG. 3A through FIG. 3D depict a method of manufacturing a semiconductor storage device according to an embodiment.
Figure 3B:
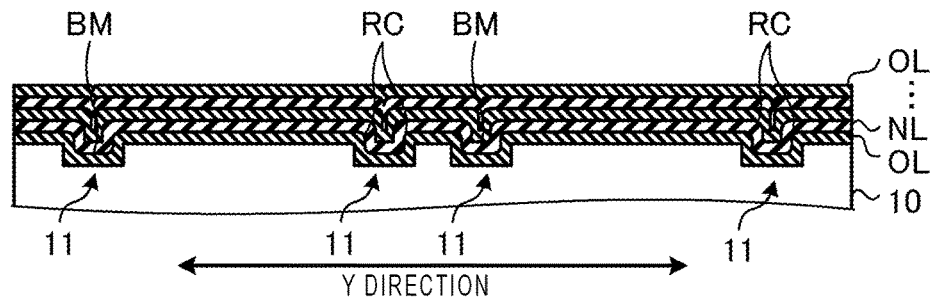
Figure 3C:
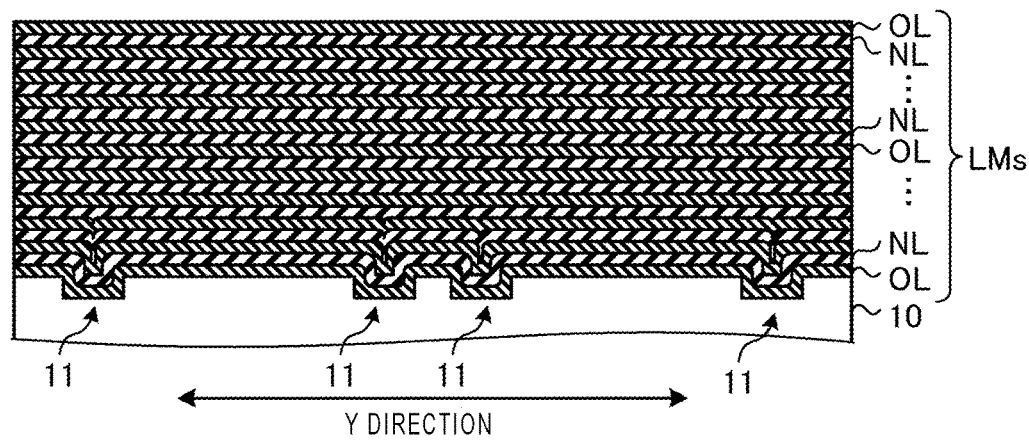

FIG. 3A illustrates a cross-section of the base layer 10 in which the recesses 11 are formed as described above. FIGS. 3B and 3C illustrate a state where a stacked body LMs is formed on the base layer 10. The stacked body LMs has a configuration in which a plurality of insulating layers NL and a plurality of insulating layers OL are alternately stacked one by one. Each insulating layer NL is a silicon nitride layer or the like that functions as a sacrificial layer, and is later replaced with a tungsten layer, a molybdenum layer or the like to form a word line.

As illustrated in FIG. 3B, the insulating layers NL and the insulating layers OL are alternately stacked one by one on the base layer 10. Initially, the insulating layers NL and the insulating layers OL are stacked along the recess 11 of the base layer 10 and are bent in the layer thickness direction.

That is, a pair of bending portions RC that covers the corners formed by the side walls of the recess 11 facing each other in the Y direction, which corresponds to the lateral direction of the stacked body LMs, and the upper surface of the base layer 10, is formed in at least the lowest insulating layer OL. Further, a flat portion BM that is sandwiched between the pair of bending portions RC and covers the bottom surface of the recess 11 is formed at least in the lowermost insulating layer OL. That is, the flat portion BM is located below the other portions of the insulating layer OL in the stacking direction of the stacked body LMs.

At this time, the shape of the bending portion RC may vary depending on the shape of the recess 11 and the formation conditions of the insulating layer OL. For example, when the insulating layer OL is formed with high followability or coverage with respect to the recess 11, the bending portion RC tends to have an angular shape along the corner of the recess 11. Further, for example, when the followability or coverage of the insulating layer OL with respect to the recess 11 is not high, the bending portion RC tends to have a curved shape that covers the corner of the recess 11 with a curved surface.

As illustrated in FIG. 3C, as the number of layers of insulating layers NL and insulating layers OL increases, the followability of the insulating layer NL and the insulating layer OL with respect to the recess 11 will be lost. As a result, in the upper layer portion of the stacked body LMs, the insulating layer NL and the insulating layer OL are formed substantially flat.

Figure 3D:
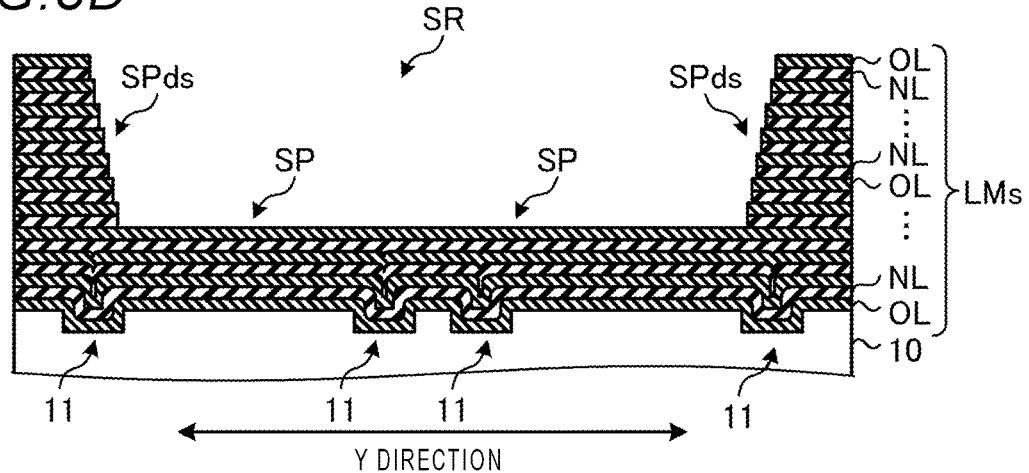

As illustrated in FIG. 3D, in a partial region of the stacked body LMs, the insulating layers NL and the insulating layers OL are dug down (etched) in a stepped manner to form a stair portion SP. The stair portion SP is formed by repeating slimming of a mask pattern such as a photoresist layer and etching of the insulating layers NL and the insulating layers OL of the stacked body LMs a plurality of times.

That is, a mask pattern having an opening at the formation position of the stair portion SP is formed on the upper surface of the stacked body LMs, and for example, the insulating layers NL and the insulating layers OL are etched away one by one. By treatment with oxygen plasma or the like, the mask pattern end of the opening is retracted to widen the opening, and the insulating layers NL and the insulating layers OL are further etched away one by one. By repeating such a process a plurality of times, the insulating layers NL and the insulating layers OL at the opening of the mask pattern are dug down in a stepped manner.

Further, every time the above process is repeated a predetermined number of times, a new mask pattern is formed so that the layer thickness of the mask pattern is maintained at a predetermined thickness or more. At this time, the position of the opening of the mask pattern is adjusted to form a relatively gently inclined stair portion SP and steep dummy stair portions SPdf and SPds. Similarly, the end positions of the mask pattern at both ends in the longitudinal direction of the stacked body LMs and both ends in the lateral direction of the stacked body LMs are adjusted to form steep dummy stair portions SPdx and SPdy at four ends of the stacked body LMs, respectively, as in the dummy stair portions SPdf and SPds.

FIG. 3D is a cross-sectional view of the third step of the stair portion SP formed in this way. The cross-section illustrated in FIG. 3D is separated into two stair portions SP by the contact LI formed later. Further, the dummy stair portion SPds is formed on one side of each stair portion SP in the lateral direction.

Figure 4A:
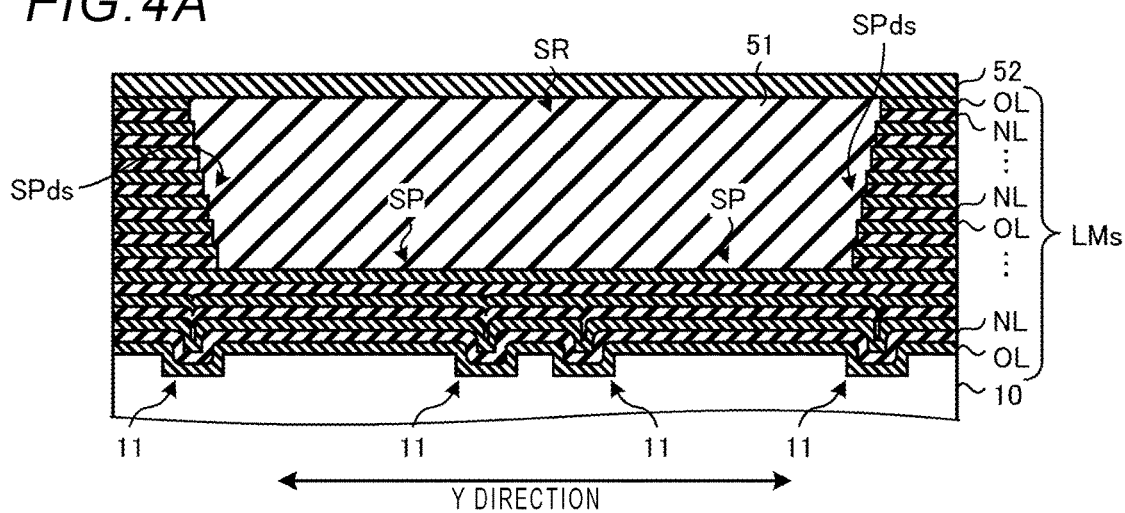
FIG. 4A through FIG. 4C depict a method of manufacturing a semiconductor storage device according to an embodiment.

As illustrated in FIG. 4A, the insulating layer 51 such as a silicon oxide layer that covers the stair portion SP and reaches the height of the upper surface of the stacked body LMs is formed. That is, the insulating layer 51 is formed in a bowl-shaped region surrounded by the stair portions SP and the dummy stair portions SPds and SPdf. The insulating layer 51 is also formed on the peripheral portion of the stacked body LMs including the dummy stair portions SPdx and SPdy. Further, the insulating layer 52 that covers the upper surface of the stacked body LMs and the upper surface of the insulating layer 51 in the bowl-shaped region including the stair portion SP is further formed.

Figure 4B:
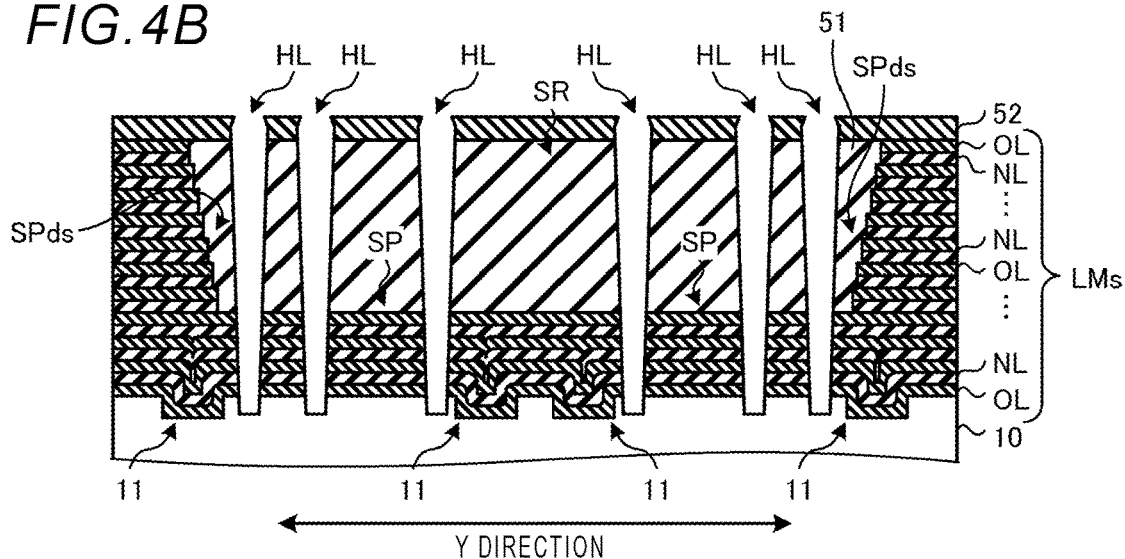

As illustrated in FIG. 4B, a plurality of holes HL that reach the base layer 10 through the insulating layers 52 and 51 and the stacked body LMs are formed in the stair region SR.

Figure 4C:
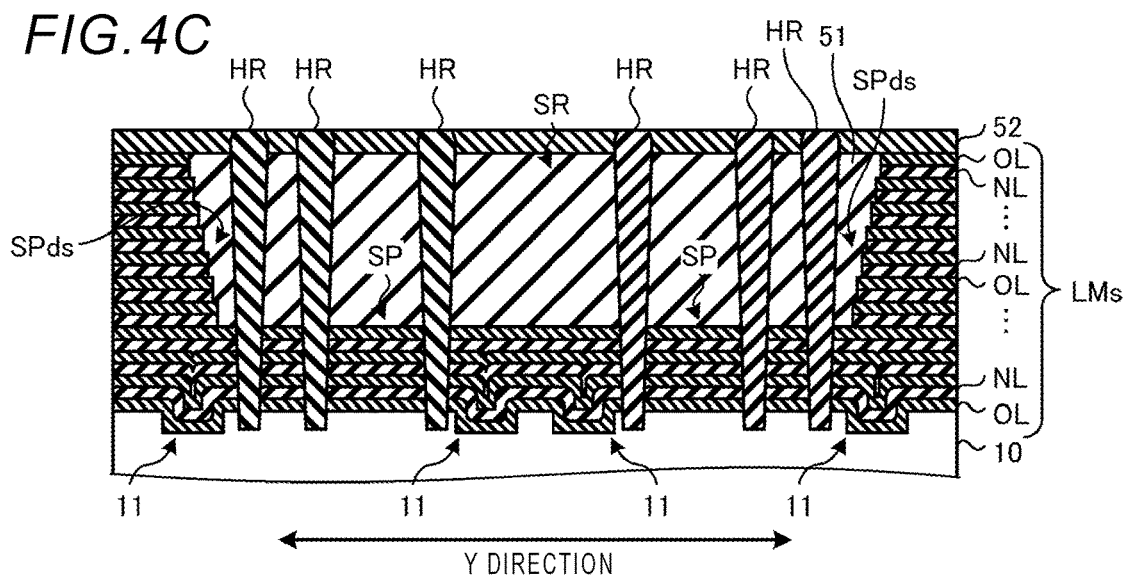

As illustrated in FIG. 4C, the holes HL are filled with insulating layers such as silicon oxide layers to form a plurality of columnar portions HR.

Similarly at this time, a plurality of columnar portions HR are also formed in the dummy stair portions SPdx and SPdy at the end of the stacked body LMs.

FIGS. 5A to 5C and FIGS. 6A to 6C illustrate cross-sections of a region that will become a memory region along the Y direction. However, as described above, since the pillar PL has a circular shape, an elliptical shape, an oval shape, or the like, it has the same cross-sectional shape regardless of the direction of the cross-section.

As illustrated in FIG. 5A, even in the region where the memory region MR is to be formed, by the above-mentioned various processes, the stacked body LMs is formed on the base layer 10, and the insulating layer 52 is formed on the stacked body LMs. In this state, a plurality of memory holes MH that reach the base layer 10 through the insulating layer 52 and the stacked body LMs are formed.

As illustrated in FIG. 5B, a memory layer ME in which a block insulating layer BK, a charge storage layer CT, and a tunnel insulating layer TN are stacked in this order from the outer peripheral side of each memory hole MH is formed in the memory hole MH. As described above, the block insulating layer BK and the tunnel insulating layer TN are, for example, a silicon oxide layer or the like, and the charge storage layer CT is, for example, a silicon nitride layer or the like.

Further, a channel layer CN such as a polysilicon layer or an amorphous silicon layer is formed inside the tunnel insulating layer TN. The channel layer CN is also formed at the bottom of the memory hole MH. Further, the interior of the channel layer CN is filled with a core layer CR such as a silicon oxide layer.

As illustrated in FIG. 5C, the core layer CR exposed from the upper surface of the insulating layer 52 is etched away up to a predetermined depth to form a dent DN.

As illustrated in FIG. 6A, the interior of the dent DN is filled with a polysilicon layer, an amorphous silicon layer, or the like to form a cap layer CP. As a result, a plurality of pillars PL are formed.

As illustrated in FIG. 6B, the insulating layer 52 is etched back together with the upper surface of the cap layer CP. This results in reducing the thickness of the cap layer CP.

As illustrated in FIG. 6C, the insulating layer 52 thinned by the etch-back is stacked. As a result, the upper surface of the cap layer CP is covered with the insulating layer 52.

The process of forming the stair portion SP of FIGS. 3D to 4A, the process of forming the columnar portion HR of FIGS. 4B to 4C, and the process of forming the pillar PL of FIGS. 5A to 6C can be performed in any order.

Figure 7A:
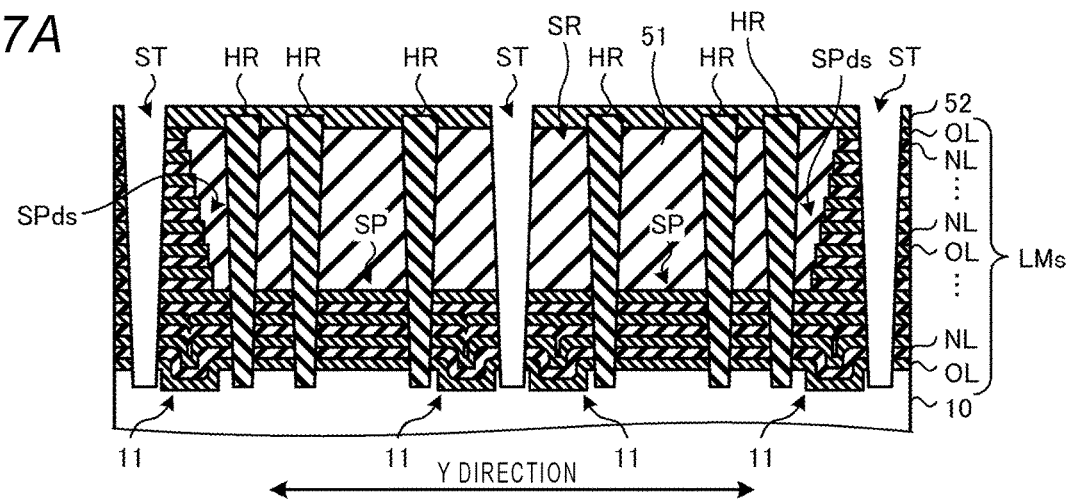
FIG. 7A through FIG. 7C depict a method of manufacturing a semiconductor storage device according to an embodiment.

As illustrated in FIG. 7A, also in the stair region SR, by the above-mentioned process of FIGS. 5A to 5C and FIGS. 6A to 6C, the upper end portion of the columnar portion HR is etched back, the insulating layer 52 is stacked, and the upper surface of the columnar portion HR is covered with the insulating layer 52.

In this state, a plurality of slits ST that reach the base layer 10 through the insulating layers 52 and 51 and the stacked body LMs are formed. The individual slit ST extends in the longitudinal direction of the stacked body LMs through the stacked body LMs over the stair region SR and the memory region MR so as to divide the stacked body LMs in the lateral direction. The individual slit ST is disposed in the vicinity of a recess 11 of the base layer 10.

Figure 7B:
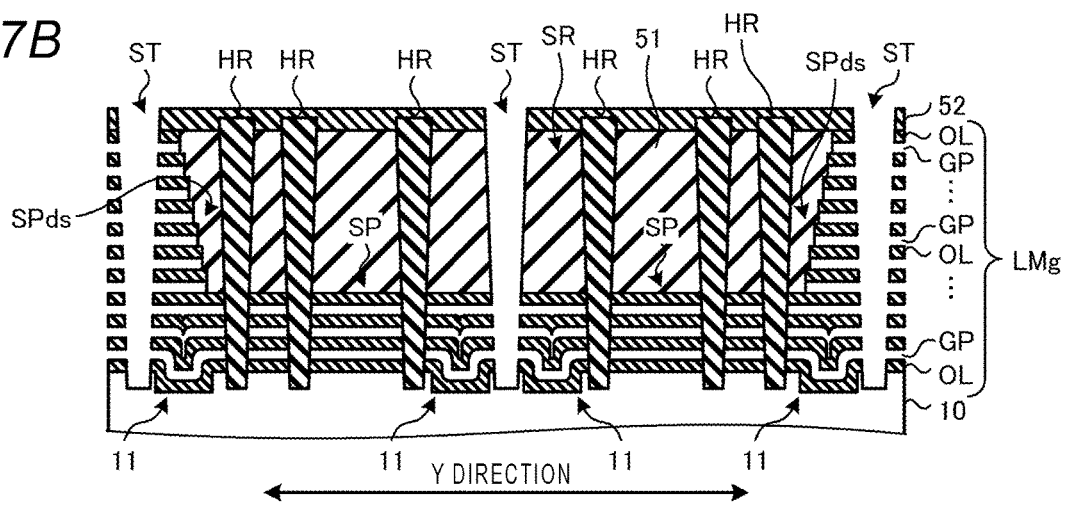

As illustrated in FIG. 7B, a chemical solution such as thermal phosphoric acid is injected from the plurality of slits ST to remove the insulating layers NL of the stacked body LMs. As a result, a stacked body LMg having a plurality of gap layers GP is formed.

The stacked body LMg has a fragile structure due to the plurality of gap layers GP. In the stair portion SP and the dummy stair portions SPdf, SPds, SPdx, and SPdy, such a fragile stacked body LMg is supported by a plurality of columnar portions HR. In the memory region MR, the fragile stacked body LMg is supported by a plurality of pillars PL. These columnar portions HR and pillars PL prevent the remaining insulating layer OL from being bent, and the stacked body LMg from being distorted or collapsed.

Figure 7C:
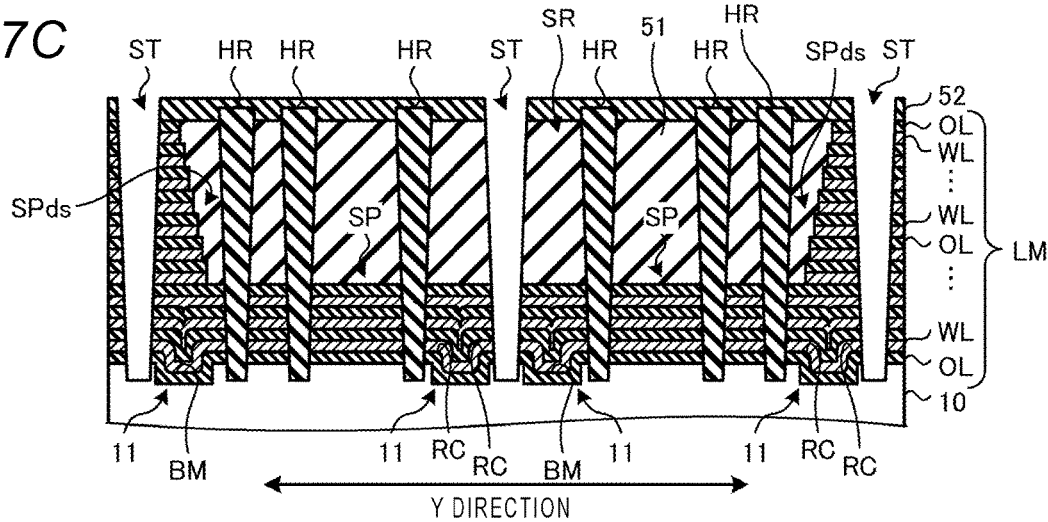

As illustrated in FIG. 7C, a raw material gas of a conductor such as tungsten or molybdenum is injected from the plurality of slits ST to fill the gap layers GP of the stacked body LMg to form a plurality of word lines WL. As a result, a stacked body LM in which the plurality of word lines WL and the plurality of insulating layers OL are alternately stacked one by one is formed.

A process of replacing the insulating layers NL illustrated in FIGS. 7A to 7C with word lines WL may be referred to as a replacement process. Through this replacement process, the bend in the layer thickness direction of at least the lowermost insulating layer OL is maintained, so that the stacked body LM after the replacement process also has the bending portion RC and the flat portion BM.

Figure 8A:
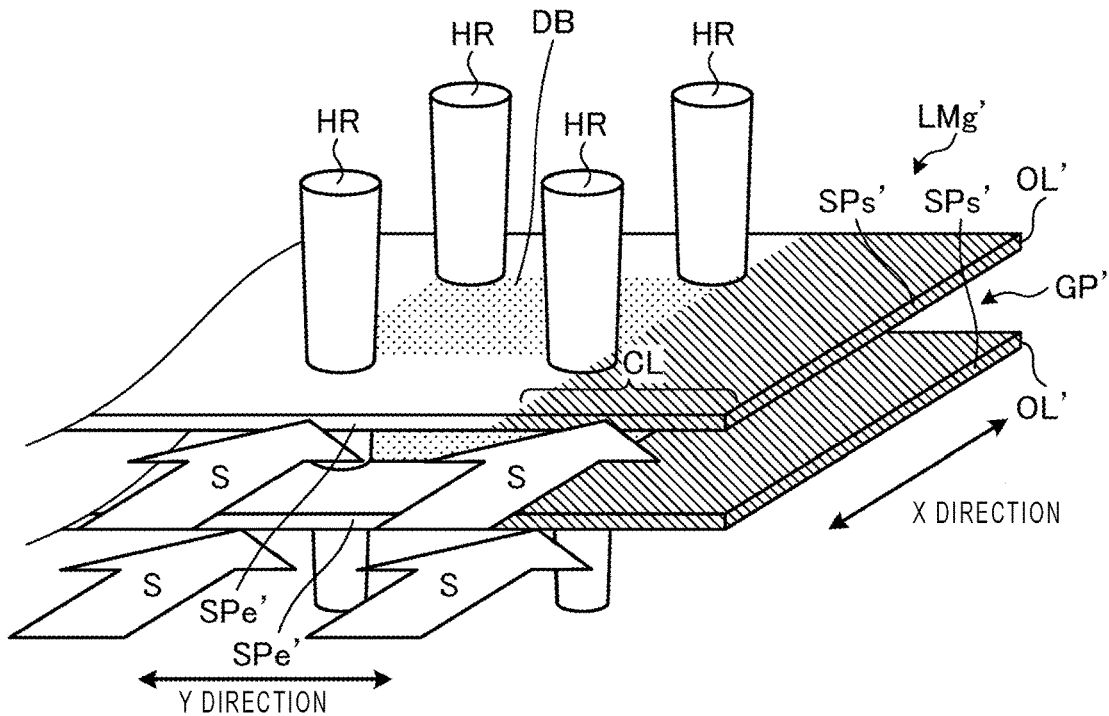
FIG. 8A and FIG. 8B depict a method of manufacturing a semiconductor storage device according to an embodiment.
Figure 8B:
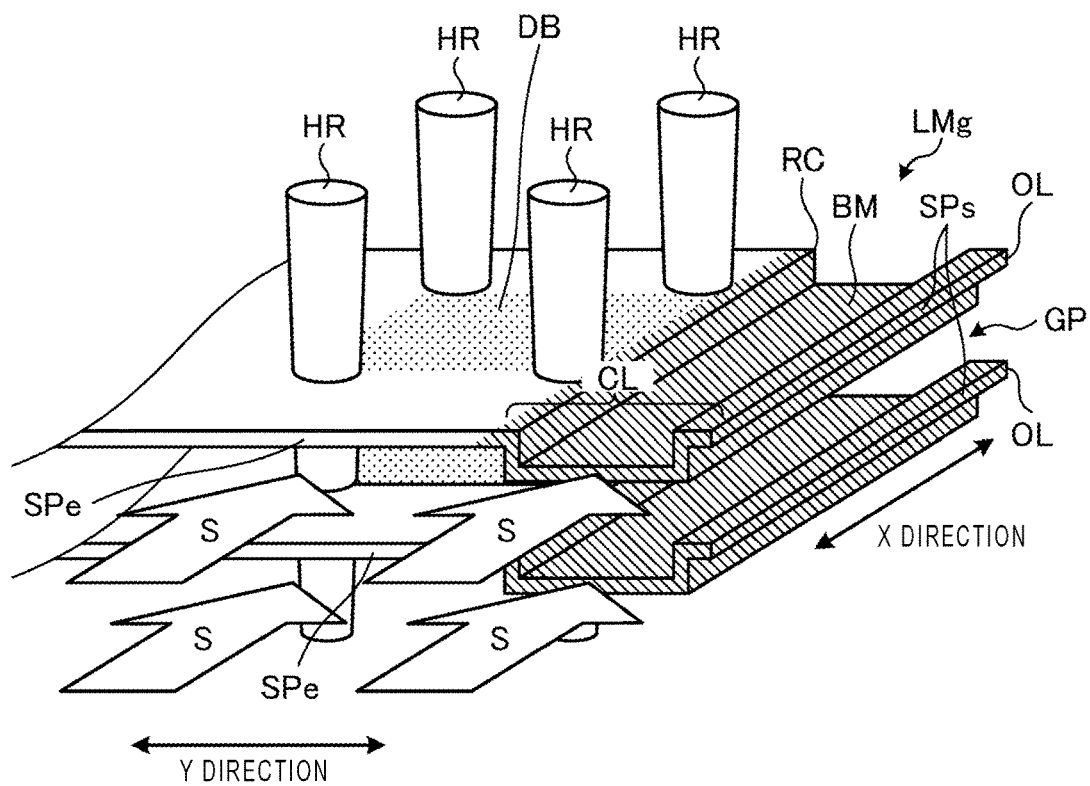

Here, FIGS. 8A and 8B illustrate a perspective view of the stair portion SP of the stacked body LMg in a state where the insulating layers NL are removed. FIG. 8A illustrates, for example, a stacked body LMg' having substantially a flat shape in which a recess is not formed in the base layer and an insulating layer OL' is not bent in the layer thickness direction. FIG. 8B illustrates a stacked body LMg in which the insulating layer OL is bent in the layer thickness direction, as described above. Further, the ends Spe' and SPe of a particular step of the stair portion SP of the insulating layers OL' and OL and the ends SPs' and SPs on the slit ST side are illustrated in FIGS. 8A and 8B, respectively.

As illustrated in FIGS. 8A and 8B, a stress S is applied toward the interior of the stacked bodies LMg' and LMg. This is because the insulating layer 51 formed on the stair portion SP causes a tensile stress toward the exterior of the insulating layer 51.

The influence of such a stress may be remarkable in the stair portion SP, the dummy stair portions SPdf and SPdx, and the like. This is because, after being divided in the lateral direction by the slit ST, the stacked body LMg undergoes a larger stress in the longitudinal direction in which the stair portion SP and the dummy stair portions SPdf and SPdx extend, and the arrangement density of columnar portions HR supporting the stacked body LMg in the stair portion SP and the dummy stair portions SPdf and SPdx is lower than the arrangement density of pillars PL supporting the stacked body LMg in the memory region MR.

In addition, since the stair portion SP has a longer stair length than the dummy stair portions SPdf and SPdx and is covered with the insulating layer 51 having a larger volume than the dummy stair portions SPdf and SPdx, it can be considered that the influence of the stress is more likely to be remarkable.

Here, an inner region DB of each of the insulating layers OL and OL' is supported by a plurality of columnar portions HR arranged in the form of a grid, and is in a state like a fixed beam at both ends. On the other hand, the ends SPs and SPs' of the insulating layers OL and OL' on the slit ST side are not supported by the columnar portions HR. Therefore, a region CL near the ends SPs and SPs' of the insulating layers OL and OL' is in a state like a cantilever in which only one side in the lateral direction of the stacked body LMg is supported by the columnar portions HR near the ends SPs and SPs'.

As illustrated in FIG. 8A, in the stacked body LMg' in which the insulating layers OL' are flatly stacked, from the viewpoint described above, the region CL of the stair portion SP is more susceptible to a stress than the region DB.

As illustrated in FIG. 8B, in the stacked body LMg, each insulating layer OL has, for example, a crank shape, including the bending portions RC in the region CL where the influence of stress is stronger. The insulating layer OL may be folded to have curved bending portions RC. Such shapes of the insulating layers OL increase the structural strength in the more fragile region CL. Therefore, it is possible to prevent the insulating layers OL from being bent and the stacked body LMg from being distorted or collapsed.

After the process of FIG. 7C, the insulating layer 55 is formed on the side wall of each slit ST, and the conductive layer 22 is filled in the insulating layer 55. As a result, plate-shaped contacts LI are formed. However, the interior of each slit ST may be filled with an insulating layer to form a plate-shaped portion that does not function as a contact LI.

Further, a hole that reaches the word line WL of the uppermost step belonging to each step of the stair portion SP is formed in the step, the insulating layer 54 is formed on the side wall of the hole, and the conductive layer 21 is filled in the insulating layer 54 to form the contact CC connected to each of a plurality of word lines WL.

Further, the insulating layer 53 is formed on the insulating layer 52, and the plug V0 connected to each of the contacts LI and CC through the insulating layer 53 is formed. Further, the plug CH connected to each pillar PL through the insulating layers 53 and 52 is formed. Further, an upper layer wiring or the like connected to the plugs V0 and CH is formed.

From the above, the semiconductor storage device 1 according to an embodiment is manufactured.

(Configuration Example of Base Layer)

Figure 9:
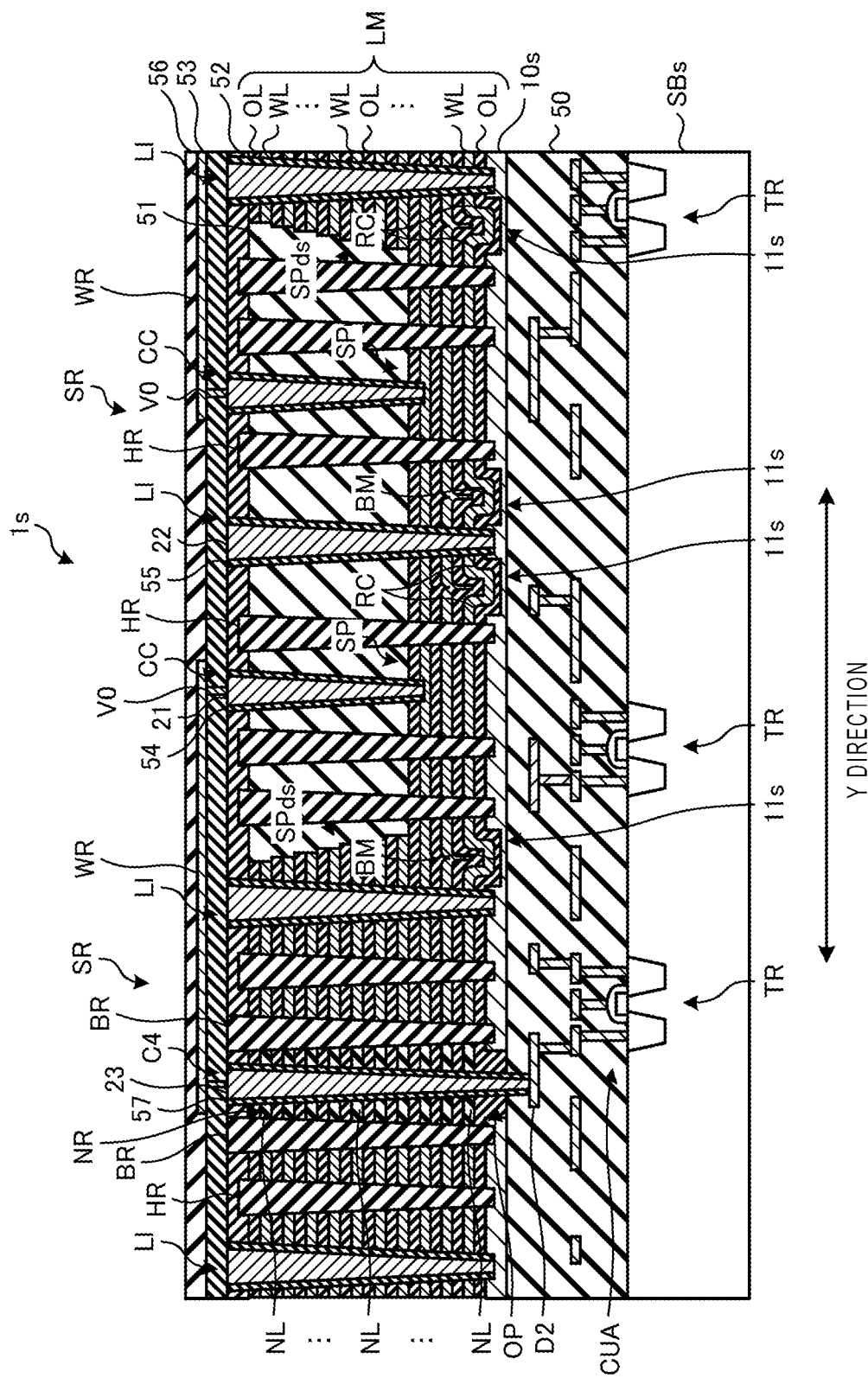
FIG. 9 is a cross-sectional view illustrating a base layer provided in a semiconductor storage device according to an embodiment.
Figure 10:
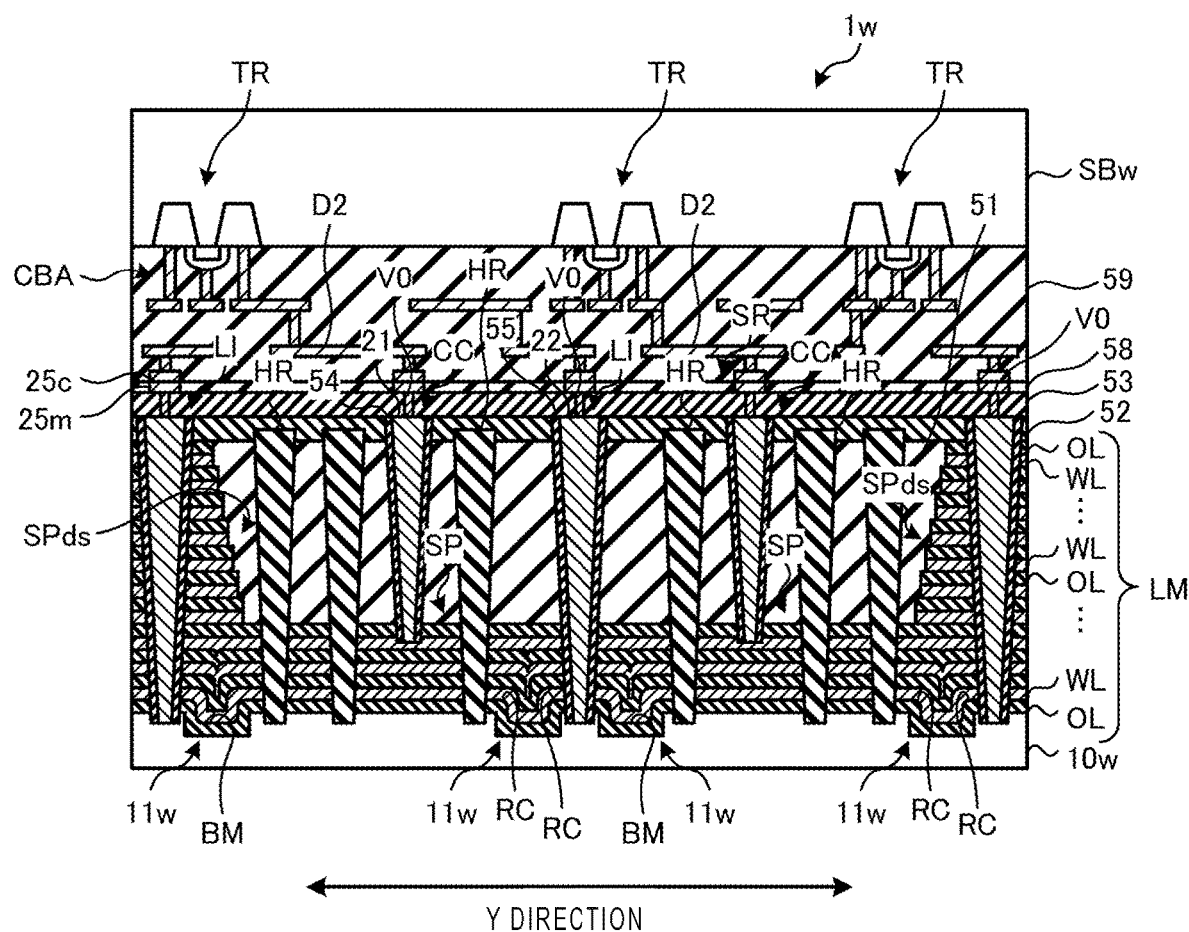
FIG. 10 is a cross-sectional view illustrating a base layer provided in a semiconductor storage device according to an embodiment.

Next, some configuration examples of the base layer 10 will be described with reference to FIGS. 9 and 10. FIGS. 9 and 10 are cross-sectional views of base layers provided in semiconductor storage devices 1s and 1w, respectively.

As illustrated in FIG. 9, the semiconductor storage device 1s includes a source line 10s, which is a conductive layer such as a polysilicon layer, as the base layer 10.

More specifically, the semiconductor storage device 1s includes a semiconductor substrate SBs such as a silicon substrate, a peripheral circuit CUA, the source line 10s, and a stacked body LM.

The peripheral circuit CUA has a transistor TR including an active region and a gate electrode formed on the semiconductor substrate SBs, and thus contributes to the operation of the memory cells MC (see FIG. 1B). The peripheral circuit CUA is covered with an insulating layer 50. A plurality of wirings including wirings D2, contacts, and vias are disposed in the insulating layer 50 and are electrically connected to the peripheral circuit CUA.

The source line 10s is disposed on the insulating layer 50. A plurality of recesses 11s similar to the above-described recesses 11 are formed in the upper surface of the source line 10s. The above-described stacked body LM is disposed on the source line 10s.

That is, the stacked body LM includes the memory region MR (see FIG. 1A) in which the pillars PL are disposed, and the stair portion SP in which the contacts CC and the columnar portions HR are disposed, and at least the lowermost insulating layer OL in the stair portion SP is bent in the layer thickness direction near the contacts LI. The insulating layers 52, 53, and 56 are arranged in this order on the stacked body LM.

Further, in addition to the above-described configuration, the stacked body LM includes an insulating region NR sandwiched between block portions BR in the stair region SR that is between a pair of contacts LI and adjacent to a region where the stair portion SP is disposed in the lateral direction of the stacked body LM. The insulating region NR has a configuration in which a plurality of insulating layers NL and OL are alternately stacked one by one.

A pair of block portions BR penetrates the stacked body LM and extends in the longitudinal direction of the stacked body LM. The extending position of each block portions BR in the longitudinal direction of the stacked body LM substantially coincides with, for example, the position of the adjacently disposed stair portion SP in the longitudinal direction of the stacked body LM. The interior of the block portions BR is filled with an insulating layer such as a silicon oxide layer.

At the time of the above-described replacement process, such block portions BR inhibit the replacement process of the region sandwiched between the block portions BR, so that the insulating region NR is formed.

A penetrating contact C4 that penetrates the insulating layer 52 and the insulating region NR and reaches the wiring D2 through an opening OP of the source line 10s is disposed in the insulating region NR. The penetrating contact C4 includes an insulating layer 57 disposed on the side wall and a conductive layer 23 such as a copper layer filled in the insulating layer 57.

The lower end of the conductive layer 23 is connected to the wiring D2, and the upper end of the conductive layer 23 is connected to an upper layer wiring WR disposed in the insulating layer 56 via the plug V0 penetrating the insulating layer 53. As a result, the penetrating contact C4 electrically connects the peripheral circuit CUA and the upper layer wiring WR. The upper layer wiring WR is electrically connected to the contact CC via the plug V0 on the contact CC.

With the above configuration, the memory cells MC can be operated by a predetermined voltage applied from the peripheral circuit CUA to the word lines WL.

As illustrated in FIG. 10, the base layer 10 of the semiconductor storage device 1w forms a portion of a semiconductor substrate 10w such as a silicon substrate.

More specifically, the semiconductor storage device 1w includes the semiconductor substrate 10w, a stacked body LM, a peripheral circuit CBA, and a semiconductor substrate SBw different from the semiconductor substrate 10w.

In the semiconductor storage device 1w, the semiconductor substrate 10w has a role as a source line and a role as a support substrate for supporting the stacked body LM. A plurality of recesses 11w similar to the above-described recesses 11 are formed in the upper surface of the semiconductor substrate 10w. The above-described stacked body LM is disposed on the semiconductor substrate 10w.

That is, the stacked body LM includes the memory region MR (see FIG. 1A) in which the pillars PL are disposed, and the stair portion SP in which the contacts CC and the columnar portions HR are disposed, and at least the lowermost insulating layer OL in the stair portion SP is bent in the layer thickness direction near the contacts LI. The insulating layers 52, 53, and 58 are arranged in this order on the stacked body LM.

Further, the semiconductor substrate SBw on which the peripheral circuit CBA is disposed is bonded to the semiconductor substrate 10w via the insulating layer 58 disposed above the stacked body LM.

The peripheral circuit CBA has a transistor TR including an active region and a gate electrode formed on the semiconductor substrate SBw, and thus contributes to the operation of the memory cells MC (see FIG. 1B). The peripheral circuit CBA is covered with an insulating layer 59. A plurality of wirings including wirings D2, contacts, and vias are disposed in the insulating layer 59 and are electrically connected to the peripheral circuit CBA.

Further, a plurality of terminals 25m connected to the plug V0 and the like are disposed in and exposed from the insulating layer 58 of the semiconductor substrate 10w having a bonding surface with the semiconductor substrate SBw. Further, a plurality of terminals 25c connected to the wirings D2 and the like are disposed in and exposed from the insulating layer 59 of the semiconductor substrate SBw having a bonding surface with the semiconductor substrate 10w.

At the bonding surfaces of the insulating layers 58 and 59, these terminals 25m and 25c are connected to each other. As a result, the contact CC and the peripheral circuit CBA are electrically connected to each other via the terminals 25m and 25c and the like.

With the above configuration, the memory cells MC can be operated by a predetermined voltage applied from the peripheral circuit CBA to the word lines WL.

In the bonded-type semiconductor storage device as illustrated in FIG. 10, the source line and the support substrate may be provided separately. In such a case, the support substrate does not have to be a semiconductor substrate such as a silicon substrate, and may be, for example, an insulating substrate such as a ceramic substrate or a quartz substrate. A source line as the base layer 10 such as a polysilicon layer may be formed on such a support substrate, which is equivalent to the above-described semiconductor substrate 10w. At this time, the support substrate may be removed after being bonded to the semiconductor substrate SBw on which the peripheral circuit CBA is disposed.

Further, when a semiconductor substrate such as a silicon substrate is adopted as the base layer 10, the semiconductor storage device is not of the bonded type as described above, but the stacked body LM may be disposed on the semiconductor substrate, and the peripheral circuit that contributes to the operation of the memory cells may be disposed on the semiconductor substrate. In such a case, the peripheral circuit may be disposed in the peripheral region PER (see FIG. 1A) or the like outside the stacked body LM.

In the manufacturing process of a semiconductor storage device such as a three-dimensional nonvolatile memory, a replacement process of replacing sacrificial layers such as silicon nitride layers with conductive layers such as tungsten layers may be performed. In the replacement process, the sacrificial layers are removed to thereby make a stacked body fragile. Further, as described above, a compressive stress acts on the stacked body due to the insulating layer formed above the stair portion and the like. As a result, insulating layers such as silicon oxide layers remaining in the stacked body may be bent, or the stacked body itself may be distorted or collapsed. Even if columnar portions that support the stacked body are disposed in the stair portion, there is a limit in increasing the density of the arrangement of columnar portions, and thus the influence of such a stress may not be sufficiently prevented.

When an insulating layer remaining in the stacked body is bent, the thickness of a word line formed thereafter may become uneven, or the gap layer may be blocked by the insulating layer adjacent in the stacking direction to disconnect the word line. In addition, due to the distortion of the entire stacked body, a contact connected to each step of the stair portion may be disposed outside the step of the stair portion, or the columnar portions disposed in the stair portion may be tilted to come into contact with the contact of each step. When the insulating layer is made thick so as not to bend the insulating layer, the volume of the stacked body increases, which may be harmful to the miniaturization of the semiconductor storage device.

According to the above-described semiconductor storage device 1, at least the lowermost insulating layer OL of the plurality of insulating layers OL is bent in the thickness direction of the insulating layer OL at the end position along the longitudinal direction of the stacked body LM in the stair portion SP. More specifically, the base layer 10 is disposed below the step portion SP, and the recess 11 extending in the longitudinal direction of the stacked body LM is formed in the vicinity of the contact LI that divides the stacked body LM in the lateral direction. Therefore, at least the lowermost insulating layer OL of the plurality of insulating layers OL is bent in the thickness direction of the insulating layer OL along the recess 11.

As described above, since the insulating layer OL is bent in the layer thickness direction before the replacement process, it is possible to increase the structural strength of the stacked body LMg containing the region CL which is in a state like a cantilever during the replacement process. Therefore, the bend of the insulating layer OL and the distortion and collapse of the stacked body LMg are prevented. Further, for example, sufficient strength can be obtained without thickening the insulating layer OL, so that the semiconductor storage device 1 can be easily miniaturized.

It is confirmed that the influence of the stress is remarkable in the region CL belonging to the insulating layer OL close to the base layer 10 under the stacked body LMg, among the regions CL of the stair portion SP which is easily affected by the stress. Compared to the stacked body LMg having the stacked structure, the base layer 10 has a solid structure composed of, for example, a single material. Therefore, it is presumed that a boundary portion between the base layer 10 and the stacked body LMg is one of the regions which are most susceptible to the influence of the stress.

As described above, the degree of bend of the insulating layer OL decreases toward the upper layer of the stacked body LMg. However, even if the effect of the insulating layer OL bent in the layer thickness direction mainly occurs at the lower layer portion of the stacked body LMg including the lowermost insulating layer OL, it is still sufficient to prevent the influence of the stress.

According to the above-described semiconductor storage device 1, at least the lowermost insulating layer OL includes the pair of bending portions RC and the flat portion BM sandwiched between the bending portions RC. In this way, when the insulating layer OL has a folded shape or a crank shape including the pair of bending portions RC in the region CL, it is possible to further increase the structural strength of the stacked body LMg.

According to the above-described semiconductor storage device 1, one recess 11 extends in the longitudinal direction of the stacked body LM below the end position of the stacked body LM on one side divided by the contact LI. Along with this, the pair of bending portions RC extend in the longitudinal direction of the stacked body LM at the end position of the stacked body LM on one side divided by the contact LI.

In this way, when the recess 11 of the base layer 10 is disposed below the end position of the stacked body LM in contact with the contact LI, and the insulating layer OL in the region CL is folded, including the pair of bending portions RC, or is bent in a crank shape, it is possible to increase the structural strength in the region CL that is easily affected by the stress.

(First to Fourth Modifications)

Next, semiconductor storage devices 2 to 5 of first to fourth modifications will be described with reference to FIGS. 11 to 14. In the semiconductor storage devices 2 to 5 of the first to fourth modifications, the shape of the insulating layer OL is different from that of the above-described embodiment.

FIGS. 11 to 14 are cross-sectional views illustrating the semiconductor storage devices 2 to 5 according to the first to fourth modifications, respectively. FIGS. 11 to 14 are cross-sectional views taken along the Y direction including the stair portion SP of the semiconductor storage devices 2 to 5, respectively, illustrating the cross section corresponding to FIG. 1C of the above-described embodiment.

Figure 11:
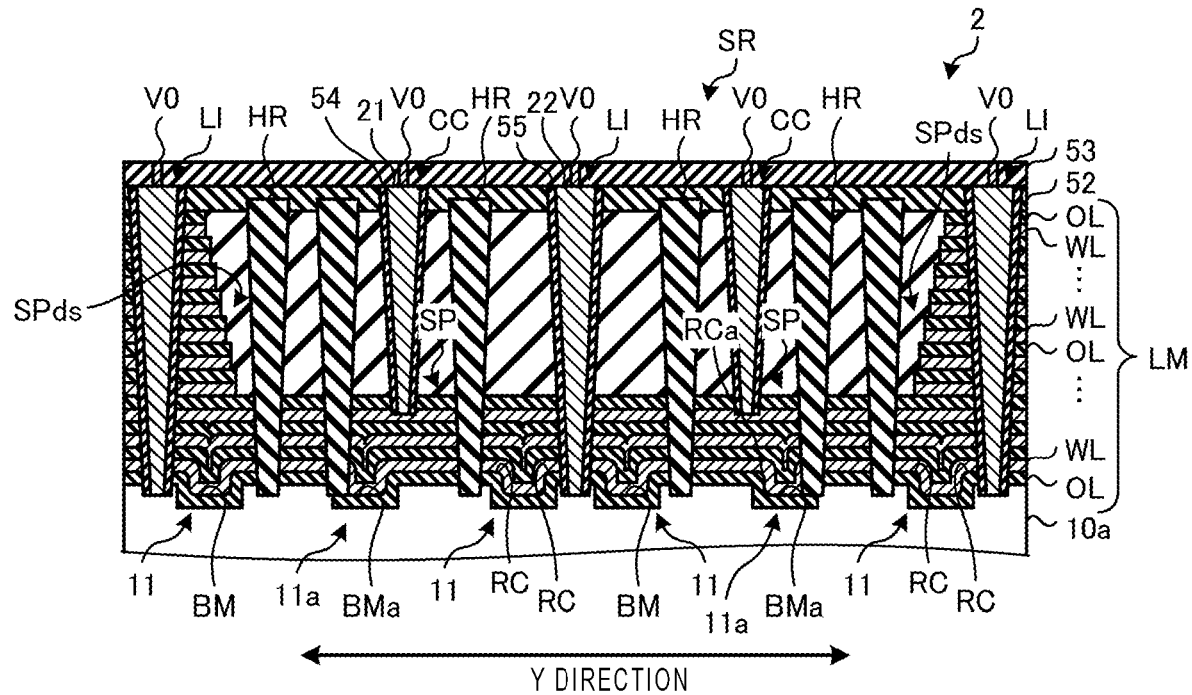
FIG. 11 is a cross-sectional view illustrating a structure of a semiconductor storage device according to a first modification of an embodiment.

As illustrated in FIG. 11, in the semiconductor storage device 2 of the first modification, a recess 11a extending in the longitudinal direction of the stacked body LM is disposed not only in the vicinity of a contact LI but also in the upper surface of a base layer 10a at a position separated from the contact LI in the lateral direction of the stacked body LM. As a result, of the plurality of insulating layers OL of the stacked body LM, at least the lowermost insulating layer OL has a bent shape in the layer thickness direction of the insulating layer OL even at a position separated from the contact LI in the lateral direction of the stacked body LM.

That is, this insulating layer OL has a pair of bending portions RCa that cover the corner formed by the side wall of the recess 11a and the upper surface of the base layer 10a. Further, this insulating layer OL has a flat portion BMa that is sandwiched between the pair of bending portions RCa and covers the bottom surface of the recess 11a.

Here, the distance from the upper surface of the flat portion BMa to the upper surface of the other portion of the insulating layer OL is preferably 20% or more of the thickness of the insulating layer OL. As a result, it is possible to obtain sufficient structural strength.

The number and arrangement of recesses 11a may be appropriately adjusted between a pair of contacts LI adjacent to each other in the lateral direction of the stacked body LM. Along with this, at least the lowermost insulating layer OL is bent in the layer thickness direction multiple times, which corresponds to the number of the recesses 11a between the pair of contacts LI.

Figure 12:
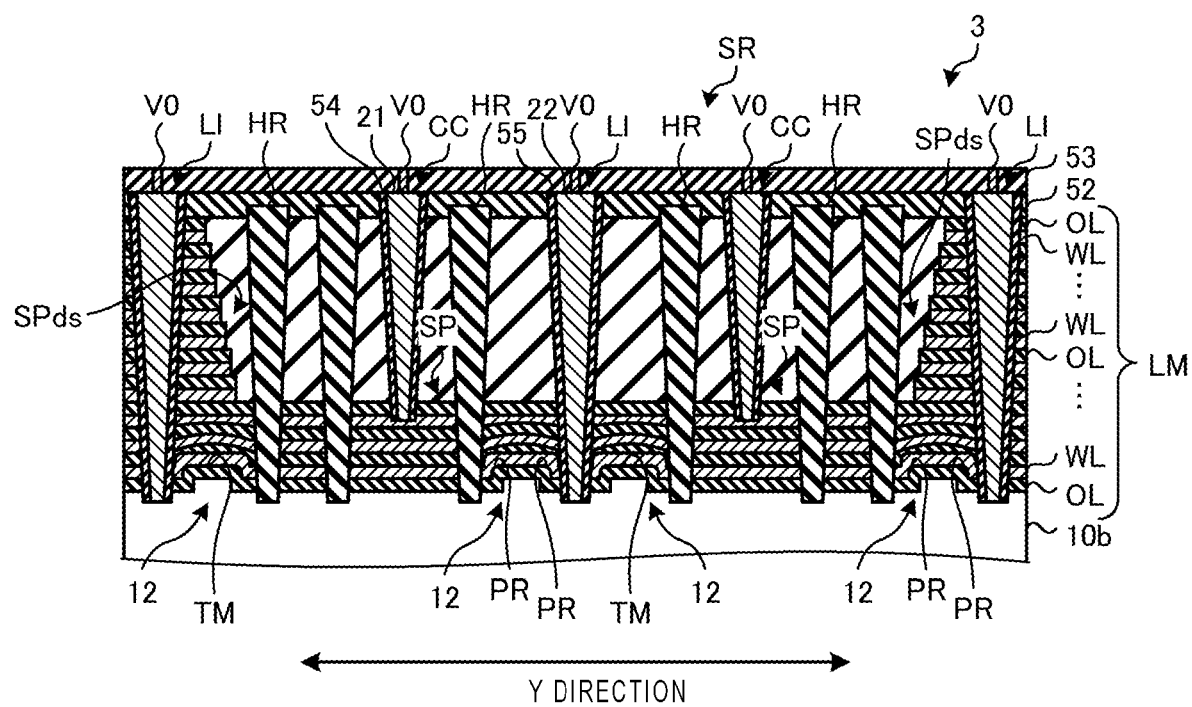
FIG. 12 is a cross-sectional view illustrating a structure of a semiconductor storage device according to a second modification of an embodiment.

As illustrated in FIG. 12, the semiconductor storage device 3 of the second modification includes convex portions 12 on the upper surface of a base layer 10b near contacts LI.

The convex portion 12 protrudes from the upper surface of the other portion of the base layer 10b and extends in the longitudinal direction of the stacked body LM below the end position of the stacked body LM on one side divided by the contact LI. As a result, of the plurality of insulating layers OL of the stacked body LM, at least the lowermost insulating layer OL is bent in the layer thickness direction of the insulating layer OL on the convex portion 12 of the base layer 10b.

That is, this insulating layer OL has a pair of bending portions PR that cover the corners formed by the side wall of the convex portion 12, which faces in the lateral direction of the stacked body LM, and the upper surface of the convex portion 12. This insulating layer OL has a flat portion TM that is sandwiched between the pair of bending portions PR and covers the upper surface of the convex portion 12. The flat portion TM is located above the other portion of the insulating layer OL in the stacking direction of the stacked body LM.

Here, a distance from the upper surface of the flat portion TM to the upper surface of the other portion of the insulating layer OL is preferably 20% or more of the thickness of the insulating layer OL. As a result, it is possible to obtain sufficient structural strength.

The convex portion 12 of the base layer 10b may be disposed not only in the vicinity of a contact LI but also on the upper surface of the base layer 10b at a position separated from a contact LI in the lateral direction of the stacked body LM. In such a case, at least the lowermost insulating layer OL is bent in the layer thickness direction of the insulating layer OL even at a position separated from a contact LI in the lateral direction of the stacked body LM.

Here, the base layer 10b having the convex portions 12 can be formed by using, for example, a photolithography technique and an etching technique as used to form the recesses 11 of the above-described embodiment. That is, a mask pattern such as a photoresist layer that covers the formation positions of the convex portions 12 and has an opening at other position is formed on the upper surface of the base layer 10b. Then, the convex portions 12 are formed by processing the base layer 10b by RIE or the like.

Alternatively, the convex portion 12 may be formed by forming an insulating layer such as a silicon oxide layer in a convex shape on the base layer 10b. When the base layer 10b is a silicon substrate or the like, the convex portion 12 may be formed by an epitaxial growth method or the like. That is, silicon crystals can be epitaxially grown at a predetermined position of the base layer 10b to form the convex portion 12 protruding from the upper surface of the base layer 10b.

Figure 13:
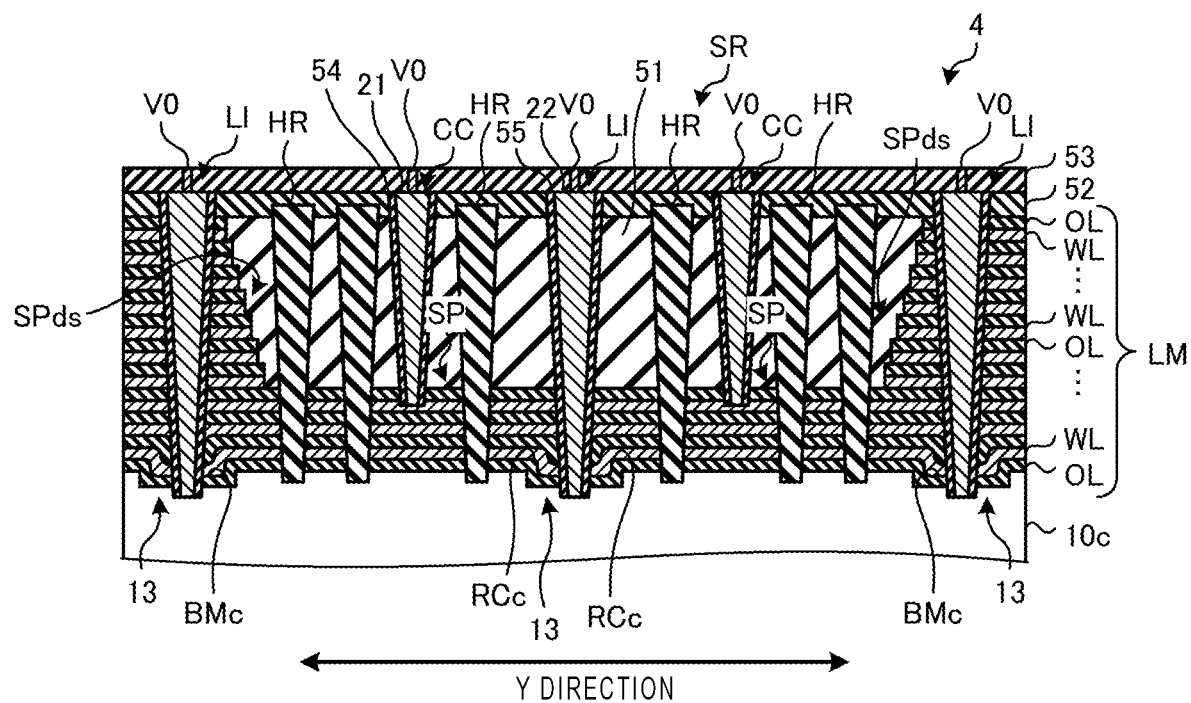
FIG. 13 is a cross-sectional view illustrating a structure of a semiconductor storage device according to a third modification of an embodiment.

As illustrated in FIG. 13, the semiconductor storage device 4 of the third modification includes recesses 13 in the upper surface of a base layer 10c located at the base portions of the contacts LI. That is, each contact LI is disposed on the bottom surface of a recess 13.

The recess 13 is recessed from the upper surface of the base layer 10c and extends in the longitudinal direction of the stacked body LM at a position where the base portion of the contact LI reaches the base layer 10c. As a result, of the plurality of insulating layers OL of the stacked body LM, at least the lowermost insulating layer OL is bent in the layer thickness direction of the insulating layer OL along the recess 13 of the base layer 10c.

That is, this insulating layer OL has a pair of bending portions RCc that cover the corners formed by the side wall of the recess 13, which faces in the lateral direction of the stacked body LM, and the upper surface of the base layer 10c. Further, this insulating layer OL has a flat portion BMc that is sandwiched between the pair of bending portions RCc and covers the bottom surface of the recess 13. The contact LI penetrates the flat portion BMc. In other words, the contact LI is disposed so as to overlap the flat portion BMc in the stacking direction of the stacked body LM.

In this way, in the semiconductor storage device 4, there is only one bending portion RCc disposed at the end portion of the stacked body LM on one side divided by the contact LI, and when viewed at the end position of the stacked body LM, the insulating layer OL is not crank-shaped or fold-shaped. Also here, a distance from the upper surface of the flat portion BMc to the upper surface of the other portion of the insulating layer OL is preferably 20% or more of the thickness of the insulating layer OL. As a result, similar to the above-described semiconductor storage device 1, the semiconductor storage device 4 can also obtain the structural strength equivalent to that of the insulating layer OL having a bent crank shape or a folded shape, including the pair of bending portions RC at the end position of the stacked body LM. In addition, the recess 13 of the base layer 10c may be disposed not only at the base portion of a contact LI but also in the upper surface of the base layer 10c at a position separated from the contact LI in the lateral direction of the stacked body LM.

Figure 14:
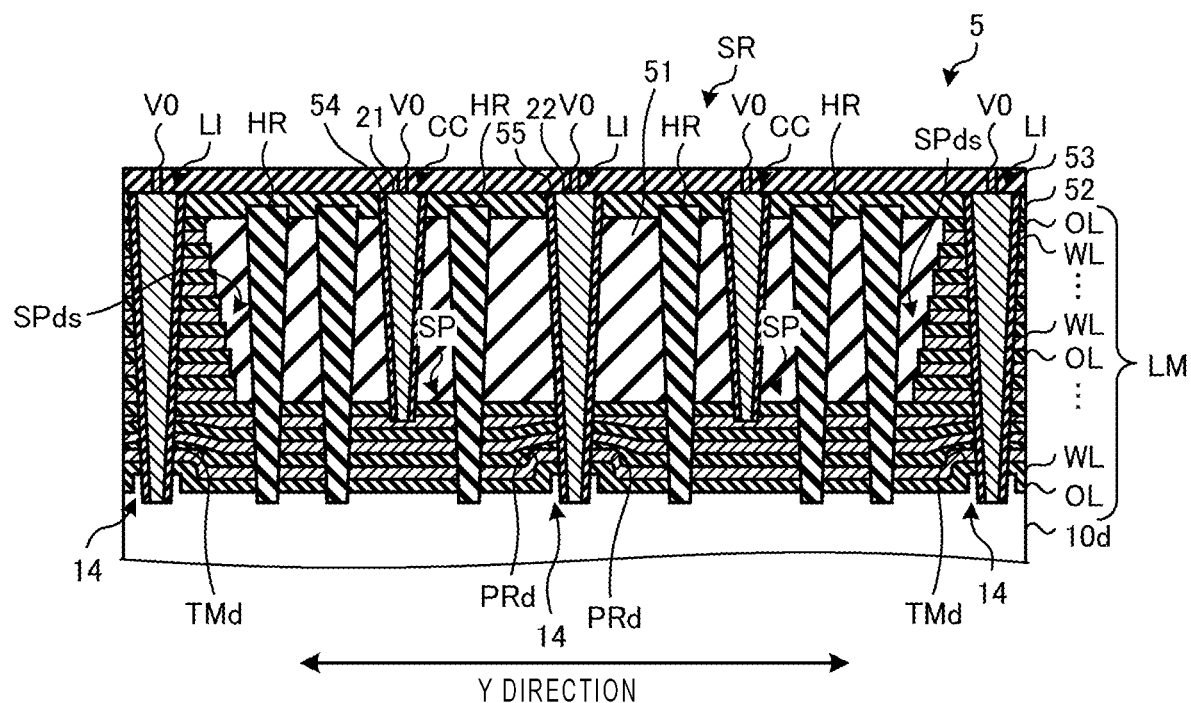
FIG. 14 is a cross-sectional view illustrating a structure of a semiconductor storage device according to a fourth modification of an embodiment.

As illustrated in FIG. 14, the semiconductor storage device 5 of the fourth modification includes convex portions 14 on the upper surface of a base layer 10d located at the base portion of the contacts LI. That is, the contact LI is disposed on the upper surface of each convex portion 14.

The convex portion 14 protrudes from the upper surface of the other portion of the base layer 10d and extends in the longitudinal direction of the stacked body LM at a position where the base portion of the contact LI reaches the base layer 10d. As a result, of the plurality of insulating layers OL of the stacked body LM, at least the lowermost insulating layer OL is bent in the layer thickness direction of the insulating layer OL along the convex portion 14 of the base layer 10d.

That is, this insulating layer OL has a pair of bending portions PRd that cover the corners formed by the side wall of the convex portion 14, which faces in the lateral direction of the stacked body LM, and the upper surface of the convex portions 14. Further, this insulating layer OL has a flat portion TMd that is sandwiched between the pair of bending portions PRd and covers the upper surface of the convex portion 14. The contact LI penetrates the flat portion TMd. In other words, the contact LI is disposed so as to overlap the flat portion TMd in the stacking direction of the stacked body LM.

In this way, in the semiconductor storage device 5, there is only one bending portion PRd disposed at the end portion of the stacked body LM on one side divided by the contact LI, and when viewed at the end position of the stacked body LM, the insulating layer OL is not crank-shaped or fold-shaped. Also here, a distance from the upper surface of the flat portion TMd to the upper surface of the other portion of the insulating layer OL is preferably 20% or more of the thickness of the insulating layer OL. As a result, similar to the semiconductor storage device 3 of the second modification, the semiconductor storage device 5 can also obtain the structural strength equivalent to that of the insulating layer OL having a bent crank shape or a folded shape, including the pair of bending portions PR at the end position of the stacked body LM.

Further, the convex portion 14 of the base layer 10d can also be formed by a method using a photolithography technique and an etching technique, film forming of an insulating layer, an epitaxial growth method, or the like, similarly to the convex portion 12 of the above-described second modification. Further, the convex portion 14 of the base layer 10d may be disposed not only at the base portion of a contact LI but also on the upper surface of the base layer 10d at a position separated from a contact LI in the lateral direction of the stacked body LM.

According to the semiconductor storage devices 2 to 5 of the first to fourth modifications, the same effects as those of the semiconductor storage device 1 of the above-described embodiment can be obtained.

(Other Modifications)

In the above-described embodiment and first to fourth modifications, the recesses 11, 11a, and 13 or the convex portions 12 and 14 of the base layers 10 and 10a to 10d, and the bending portions of the insulating layer OL accompanying these are disposed in the stair portion SP of the stair region SR, the dummy stair portion SPdx, and the like.

However, among the configurations of the above-described embodiment and first to fourth modifications, the recesses 11, 11a, and 13 or the convex portions 12 and 14 of the base layers 10 and 10b to 10d and the bending in the layer thickness direction of the insulating layer OL accompanying these disposed in the vicinity of the contact LI may also be applied to the memory region MR. This is because, similar to the stair portion SP, a compressive stress also acts on the memory region MR, and during the replacement process, the stacked body LMg may have a shape such as a cantilever shape at a position between the slit ST and the pillar PL adjacent to the slit ST.

Figure 15:
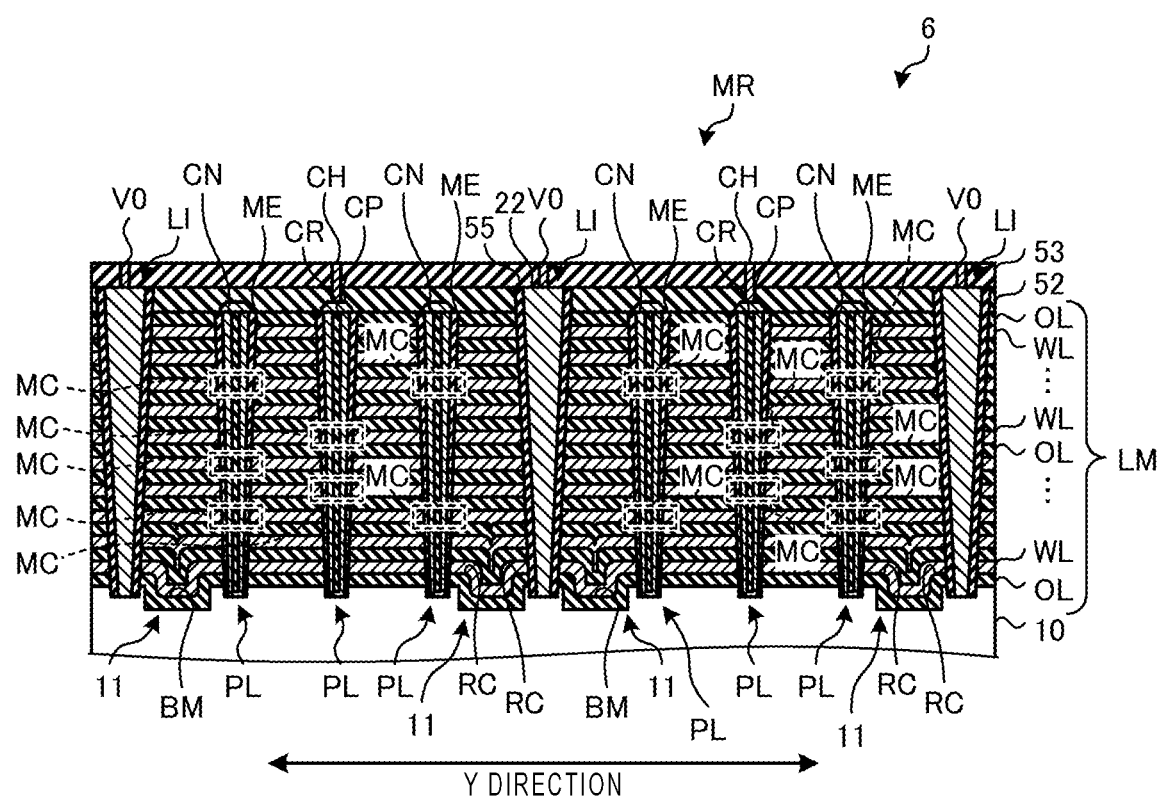
FIG. 15 is a cross-sectional view illustrating a structure of a semiconductor storage device according to another modification of an embodiment.

FIG. 15 illustrates a cross-sectional view taken along the Y direction of a semiconductor storage device 6 in which the recess 11 and the bend in the layer thickness direction of the insulating layer OL of the above-described embodiment is applied to the memory region MR. In the example of FIG. 15, the recesses 11 disposed in the above-described stair portion SP extend in the longitudinal direction of the stacked body LM from the stair region SR over the memory region MR. Along with this, the bend in the layer thickness direction of the insulating layer OL also extends in the longitudinal direction of the stacked body LM from the stair region SR over the memory region MR.

In the above-described embodiment and first to fourth modifications, the stair portion SP is disposed near the center in the longitudinal direction of the stacked body LM. However, the stair portion SP may be disposed at one end or both ends in the longitudinal direction of the stacked body LM, for example. That is, instead of the dummy stair portion SPdx, the stair portion SP having the contact CC may be disposed at the end of the stacked body LM. Also in this case, as in the above-described embodiment and first to fourth modifications, the recesses 11, 11a, and 13 or the convex portions 12 and 14 of the base layers 10 and 10a to 10d, and the bending portions of the insulating layer OL accompanying these may be disposed in the stair portion SP.

Figure 16A:
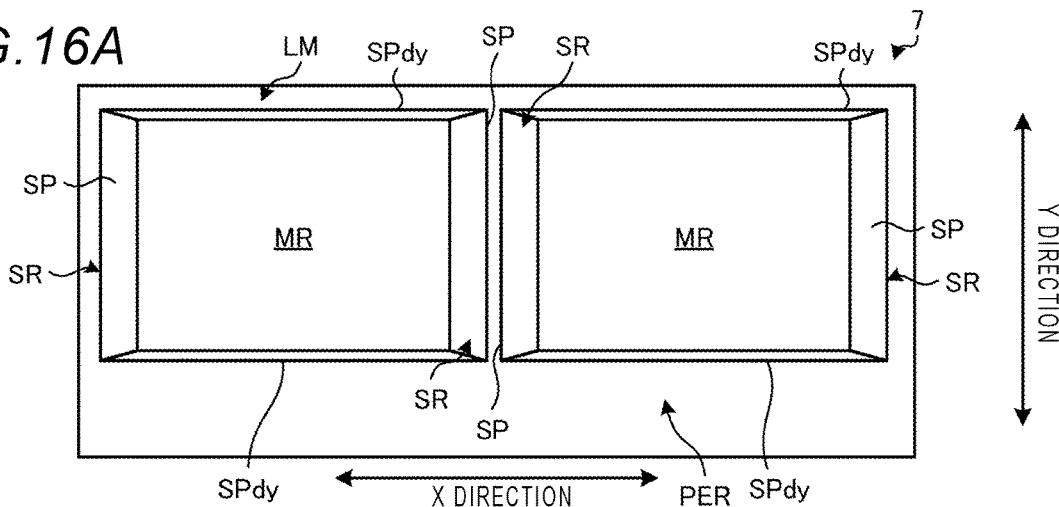
FIG. 16A through FIG. 16C are cross-sectional views illustrating a structure of a semiconductor storage device according to yet another modification of an embodiment.
Figure 16B:
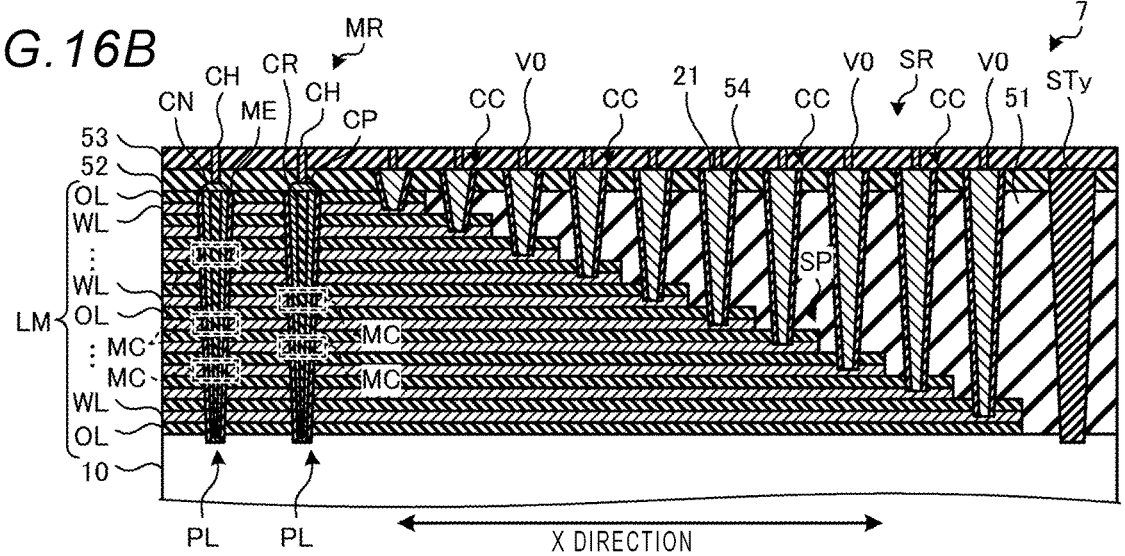
Figure 16C:
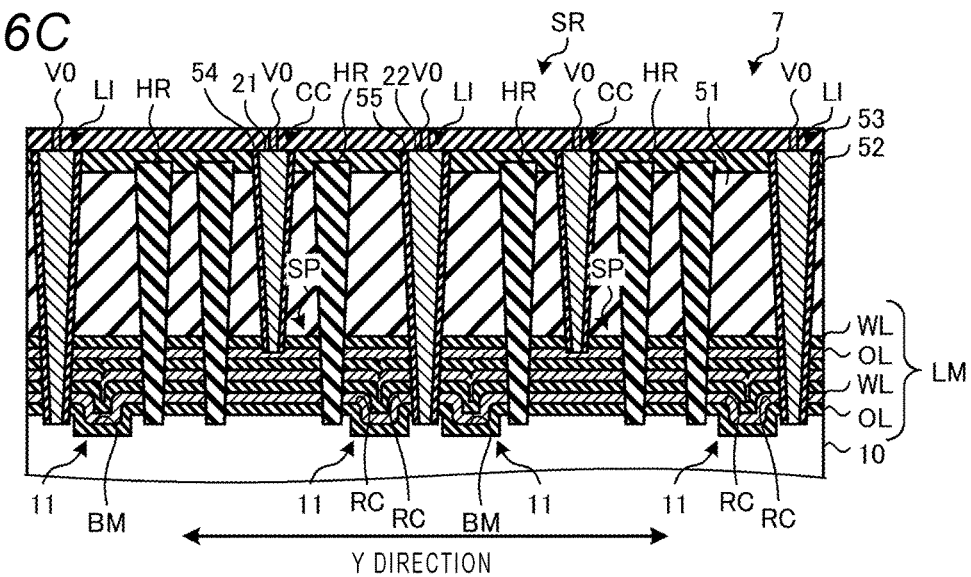

FIGS. 16A to 16C illustrate a semiconductor storage device 7 in which, instead of the stair portion SP disposed in the central portion of the stacked body LM of the above-described embodiment, the stair portion SP is disposed at both ends in the longitudinal direction of the stacked body LM. In this case, both ends of the stacked body LM where the stair portion SP is disposed become the stair region SR.

Furthermore, in this case, a separation region STy may be disposed on the outside of both ends in the longitudinal direction of the stacked body LM. The separation region STy has a configuration in which an insulating layer or the like is filled in a slit that reaches the base layer 10 through the insulating layer 51 on the outside of both ends in the longitudinal direction of the stacked body LM and extends in a direction along the Y direction.

The stair portion SP at the end of the stacked body LM faces the insulating layer 51 having a larger volume on the outside of the stacked body LM. During the replacement process, since the insulating layers 51 on the outside of both ends of the stacked body LM in the longitudinal direction are separated from the insulating layer 51 covering the stair portion SP of the stacked body LM by the above slit, a tensile stress of the insulating layer 51 can be prevented from acting on the stacked body LM. Therefore, the bend of the insulating layer OL and the distortion and collapse of the stacked body LMg can be further prevented.

In the above-described embodiment and first to fourth modifications, it is assumed that the insulating layers NL and OL are alternately stacked to form the stacked body LMs. However, the stacked body LMs may be formed in a plurality of tiers, in which case the pillar PL, the columnar portion HR, and the stair portion SP may be formed stepwise each time one tier of stacked body LMs is formed. As a result, the number of stacked layers of the word line WL can be further increased.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a stacked body in which a plurality of conductive layers and a plurality of insulating layers are alternately stacked along a stacking direction; and
a plurality of first pillars extending in the stacked body along the stacking direction to form memory cells at intersections with at least some of the plurality of conductive layers, wherein
the stacked body includes a stair portion in which the plurality of conductive layers are stacked in a stepped manner at a position separated from the plurality of first pillars in a first direction intersecting the stacking direction,
at least a lowermost insulating layer of the plurality of insulating layers has at least one bending portion bent in the stacking direction at an end of the plurality of conductive layers in the stair portion along the first direction, and
at least a lowermost conductive layer of the plurality of conductive layers has at least one bending portion bent in the stacking direction.

2. The semiconductor storage device according to claim 1, wherein the lowermost insulating layer includes:
first and second bending portions bent in the stacking direction, extending along the first direction, and separated from each other in a second direction intersecting the stacking direction and the first direction; and
a first portion sandwiched between the first and second bending portions below the other portion of the lowermost insulating layer in the stacking direction.

3. The semiconductor storage device according to claim 1, wherein the lowermost insulating layer includes:
first and second bending portions bent in the stacking direction, extending along the first direction, and separated from each other in a second direction intersecting the stacking direction and the first direction; and
a second portion sandwiched between the first and second bending portions above the other portion of the lowermost insulating layer in the stacking direction.

4. The semiconductor storage device according to claim 1, further comprising:
a plate-like portion extending in the stacked body along the stacking direction and the first direction and dividing the stacked body in a second direction intersecting the stacking direction and the first direction at the end of the plurality of conductive layers along the first direction.

5. The semiconductor storage device according to claim 4, wherein
the lowermost insulating layer includes a first portion sandwiched between the bending portion and the plate-like portion below the other portion of the lowermost insulating layer in the stacking direction, and
the plate-like portion is in contact with the first portion of the insulating layer in the second direction.

6. The semiconductor storage device according to claim 4, wherein
the lowermost insulating layer includes a second portion sandwiched between the bending portion and the plate-like portion above the other portion of the lowermost insulating layer in the stacking direction, and the plate-like portion is in contact with the second portion of the insulating layer in the second direction.

7. The semiconductor storage device according to claim 1, further comprising:
a plurality of second pillars extending in the stair portion of the stacked body along the stacking direction, wherein
the bending portion of the lowermost insulating layer extends along the first direction at a position on a side of the end of the plurality of conductive layers relative to at least one second pillar of the plurality of second pillars proximal to the end of the plurality of conductive layers in a second direction intersecting the stacking direction and the first direction.

8. A semiconductor storage device, comprising:
a stacked body in which a plurality of conductive layers and a plurality of insulating layers are alternately stacked along a stacking direction;
a plurality of first pillars extending in the stacked body along the stacking direction to form memory cells at intersections with at least some of the plurality of conductive layers; and
a plurality of second pillars extending in the stacked body along the stacking direction at a position separated from the plurality of first pillars in a first direction intersecting the stacking direction, wherein
the stacked body includes a stair portion in which the plurality of conductive layers are stacked in a stepped manner at the position at which the plurality of second pillars are formed,
at least a lowermost insulating layer of the plurality of insulating layers has at least one bending portion bent in the stacking direction, the bending portion extending along the first direction at a position on a side of an end of the plurality of conductive layers in the stair portion along the first direction relative to at least one second pillar of the plurality of second pillars proximal to the end of the plurality of conductive layers in a second direction intersecting the stacking direction and the first direction, and
in a cross section including one of the plurality of conductive layers, an area of cross section of each of the plurality of second pillars is larger than that of each of the plurality of first pillars.

9. The semiconductor storage device according to claim 8, wherein the lowermost insulating layer includes:
first and second bending portions bent in the stacking direction, extending along the first direction, and separated from each other in the second direction; and
a first portion sandwiched between the first and second bending portions below the other portion of the lowermost insulating layer in the stacking direction.

10. The semiconductor storage device according to claim 8, wherein the lowermost insulating layer includes:
first and second bending portions bent in the stacking direction, extending along the first direction, and separated from each other in the second direction; and
a second portion sandwiched between the first and second bending portions above the other portion of the lowermost insulating layer in the stacking direction.

11. The semiconductor storage device according to claim 8, wherein the plurality of first and second pillars are disposed in the stacked body in a dispersed manner, and a pitch between two of the plurality of second pillars adjacent to each other is greater than a pitch between two of the plurality of first pillars adjacent to each other.

12. The semiconductor storage device according to claim 8, wherein the plurality of first and second pillars are disposed in the stacked body in a dispersed manner, and an arrangement density of the plurality of second pillars per unit area of the plurality of conductive layers is lower than that of the plurality of first pillars per unit area of the plurality of conductive layers.

13. The semiconductor storage device according to claim 8, wherein
the plurality of first pillars are arranged in a staggered pattern when viewed from the stacking direction, and
the plurality of second pillars are arranged in a grid pattern when viewed from the stacking direction.

14. The semiconductor storage device according to claim 8, wherein
each of the plurality of first pillars has a memory layer and a channel layer arranged in this order from an outer peripheral surface of the first pillar, and
each of the plurality of second pillars has an insulator extending along the stacking direction.

15. A semiconductor storage device, comprising:
a base layer;
a stacked body on the base layer and in which a plurality of conductive layers and a plurality of insulating layers are alternately stacked along a stacking direction; and
a plurality of first pillars extending in the stacked body along the stacking direction to form memory cells at intersections with at least some of the plurality of conductive layers, wherein
the stacked body includes a stair portion in which the plurality of conductive layers are stacked in a stepped manner at a position separated from the plurality of first pillars in a first direction intersecting the stacking direction,
the base layer has a stepped portion below the stair portion in the stacking direction and extending along the first direction,
at least a lowermost insulating layer of the plurality of insulating layers has at least one bending portion bent in the stacking direction above the stepped portion in the stacking direction, and
at least a lowermost conductive layer of the plurality of conductive layers has at least one bending portion bent in the stacking direction.

16. The semiconductor storage device according to claim 15, wherein the stepped portion is a recess recessed from a surface of the base layer on which the stacked body is disposed, or a convex portion protruding from the surface of the base layer on which the stacked body is disposed.

17. The semiconductor storage device according to claim 15, further comprising:
a plurality of second pillars extending in the stair portion of the stacked body along the stacking direction,
wherein the bending portion of the lowermost insulating layer extends along the first direction at a position on a side of an end of the plurality of conductive layers in the stair portion along the first direction relative to at least one second pillar of the plurality of second pillars proximal to the end of the plurality of conductive layers in a second direction intersecting the stacking direction and the first direction.

18. The semiconductor storage device according to claim 15, further comprising:
a peripheral circuit electrically connected to the memory cells, wherein the base layer forms a portion of a semiconductor substrate on or above which the peripheral circuit is disposed.

19. The semiconductor storage device according to claim 15, further comprising:
a semiconductor substrate having an upper surface above which the stacked body is disposed; and
a peripheral circuit disposed on the semiconductor substrate and electrically connected to the memory cells, wherein
the base layer is a conductive layer other than the plurality of conductive layers and is disposed above the peripheral circuit.

* * * * *